(12) United States Patent
Nosaka et al.

(10) Patent No.: US 7,602,055 B2
(45) Date of Patent: Oct. 13, 2009

(54) SEMICONDUCTOR DEVICE AND METHOD FOR FABRICATING THE SAME

(75) Inventors: Keiji Nosaka, Kawasaki (JP); Yoshitaka Aiba, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 49 days.

(21) Appl. No.: 11/390,200

(22) Filed: Mar. 28, 2006

(65) Prior Publication Data

US 2007/0134843 A1 Jun. 14, 2007

(30) Foreign Application Priority Data

Dec. 12, 2005 (JP) ............... 2005-357418

(51) Int. Cl.
*H01L 23/02* (2006.01)
(52) U.S. Cl. .................. 257/678; 257/774; 257/787; 257/E21.231; 257/E21.278; 257/E21.293; 257/E21.585; 257/E23.125; 257/E23.128; 257/E31.117
(58) Field of Classification Search ............ 257/678, 257/639, 640, 643, 720, 760, 762, 772, 774, 257/777, 787, 792
See application file for complete search history.

(56) References Cited

U.S. PATENT DOCUMENTS

| | | | | |
|---|---|---|---|---|
| 5,241,133 A | * | 8/1993 | Mullen et al. ............... | 174/534 |
| 5,717,252 A | * | 2/1998 | Nakashima et al. ......... | 257/707 |
| 5,729,051 A | * | 3/1998 | Nakamura ................... | 257/668 |
| 5,866,950 A | * | 2/1999 | Iwasaki et al. .............. | 257/782 |
| 6,177,731 B1 | * | 1/2001 | Ishida et al. ................ | 257/780 |
| 6,551,862 B2 | * | 4/2003 | Oota et al. .................. | 438/118 |
| 6,902,955 B2 | * | 6/2005 | Tomihara .................... | 438/113 |
| 7,033,857 B2 | * | 4/2006 | Munakata et al. ........... | 438/106 |
| 7,141,884 B2 | * | 11/2006 | Kojima et al. ............... | 257/778 |

FOREIGN PATENT DOCUMENTS

JP 6-252208 9/1994

* cited by examiner

*Primary Examiner*—David Nhu
(74) *Attorney, Agent, or Firm*—Westerman, Hattori, Daniels & Adrian, LLP.

(57) ABSTRACT

A semiconductor device with a WLP structure that enables the improvement of heat resistance. A dam layer which spreads over a PI film and an Si substrate for a chip is formed between the Si substrate and a sealing resin so as to surround the chip on all sides. A material for the dam layer is selected so that good adhesion will be obtained between the dam layer and the Si substrate, between the dam layer and the PI film, and between the dam layer and the sealing resin. As a result, even if a crack appears at a portion on a side of the semiconductor device where the Si substrate and the sealed resin are joined in a heating environment, the crack does not run inside the dam layer. This prevents the peeling of the sealing resin or peeling inside the chip and the performance of the semiconductor device is maintained.

9 Claims, 50 Drawing Sheets

SEMICONDUCTOR DEVICE AND METHOD FOR FABRICATING THE SAME

CROSS-REFERENCE TO RELATED APPLICATIONS

This application is based upon and claims the benefits of priority from the prior Japanese Patent Application No. 2005-357418, filed on Dec. 12, 2005, the entire contents of which are incorporated herein by reference.

BACKGROUND OF THE INVENTION (1) Field of the Invention

This invention relates to a semiconductor device and a method for fabricating such a semiconductor device and, more particularly, to a semiconductor device having a wafer level package (WLP) structure and a method for fabricating such a semiconductor device.

(2) Description of the Related Art

In recent years attention has been riveted on a WLP technique for performing all processes, including packaging, from a process in which a chip is formed in a wafer to a process in which the wafer is diced into individual chips in a wafer state. It is expected that the WLP technique will be used for, for example, miniaturizing semiconductor devices, improving the performance of semiconductor devices, increasing the packaging density of semiconductor devices, and increasing the efficiency of a process for manufacturing semiconductor devices.

By the way, usually resin most suitable for semiconductor devices is used for manufacturing their packages with, for example, their uses or their characteristics required taken into consideration. In addition, when resin is sealed, care must be taken according to chip form so that the performance of semiconductor devices will not be deteriorated. With a chip having what is called an air bridge wiring structure, for example, to prevent resin from entering a space between wiring portions, the method of forming a dam protrusion electrode having the shape of a frame around the wiring portions has been proposed (see Japanese Unexamined Patent Publication No. 06-252208).

Usually resin is used for fabricating a package for a semiconductor device having a WLP structure, but the following problems arise.

FIG. 50 is a schematic sectional view showing an important part of an example of a conventional semiconductor device having a WLP structure.

In FIG. 50, a semiconductor device 100 which has a WLP structure and on which a dicing process has been performed by using the WLP technique is shown.

A silicon (Si) substrate 101 is used as a semiconductor substrate in the semiconductor device 100. A predetermined transistor structure (not shown) is formed in the Si substrate 101. An interlayer dielectric film 102, such as a silicon oxide ($SiO_2$) film, is formed on the Si substrate 101. An aluminum (Al) pad 103 is formed on the interlayer dielectric film 102. The pad 103 is electrically connected to a transistor formed in the Si substrate 101 via a wiring (not shown) or a via (not shown) formed in the interlayer dielectric film 102. A cover film 104, such as an $SiO_2$ film, is formed on the interlayer dielectric film 102 except on part of the surface of the pad 103. A polyimide (PI) film 105 is formed so as to cover the interlayer dielectric film 102 and the cover film 104.

In the semiconductor device 100 having the WLP structure, a copper (Cu) rewiring 106 having a predetermined pattern is formed on the pad 103 which is not covered with the cover film 104 or the PI film 105 and on the PI film 105. One end of a copper post 108 which pierces through a sealed resin 107 is connected to the rewiring 106 and the other end of the copper post 108 is connected to a solder bump 109.

The Si substrate 101 directly touches the sealed resin 107 in a scribed region 110 which remains at an edge portion of the semiconductor device 100 having the above structure. There is a comparatively great difference in thermal expansivity between the Si substrate 101 and the sealed resin 107. Accordingly, a crack 112 (indicated by a dotted line in FIG. 50) may run from a portion 111 on a side of the semiconductor device 100 where the Si substrate 101 touches the sealed resin 107 because of, for example, heat generated at the time of the operation of the semiconductor device 100 or heat generated by another element or unit located near the semiconductor device 100. If the crack 112 appears, the sealed resin 107 may peel off the Si substrate 101 or the PI film 105. If the crack 112 reaches the inside of a chip, peeling may occur inside the chip. If such peeling has occurred, there is a strong possibility that the performance of the semiconductor device 100 deteriorates.

The above problem of the peeling of a sealed resin or the like may arise not only in a semiconductor device having a WLP structure but also in a semiconductor device having, for example, a conventional chip size package (CSP) structure the fabrication of which does not need the WLP technique. That is to say, the above problem may arise in semiconductor devices that have the same structure after completion.

SUMMARY OF THE INVENTION

The present invention was made under the background circumstances described above. An object of the present invention is to provide a highly reliable semiconductor device having superior heat resistance and a method for fabricating such a semiconductor device.

In order to achieve the above first object, a semiconductor device having a chip one surface of which is sealed by a sealing resin is provided. In this semiconductor device, a dam layer is formed on an edge portion of the chip between the chip and the sealing resin.

In addition, in order to achieve the above second object, a method for fabricating a semiconductor device having a chip one surface of which is sealed by a sealing resin is provided. This method comprises the processes of forming the chip; forming a dam layer on an edge portion of the chip between the chip and the sealing resin; and sealing the chip by forming the sealing resin on a surface of the chip where the dam layer is formed.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings by taking a semiconductor device having a WLP structure as an example.

A first embodiment of the present invention will be described first.

Figure 1:
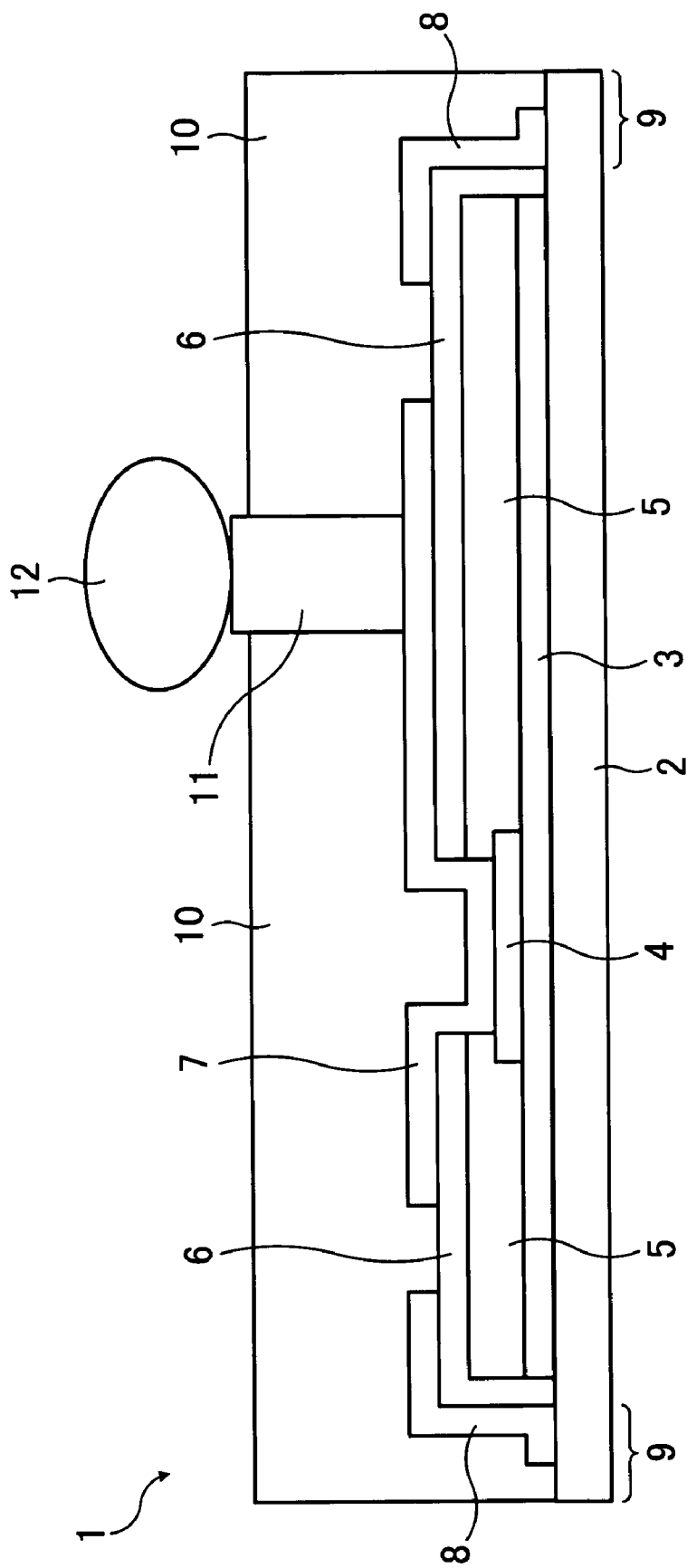
FIG. 1 is a schematic sectional view showing an important part of an example of a semiconductor device according to a first embodiment of the present invention.

FIG. 1 is a schematic sectional view showing an important part of an example of a semiconductor device according to a first embodiment of the present invention.

In FIG. 1, a semiconductor device 1 which has a WLP structure and on which a dicing process has been performed by using the WLP technique is shown.

In the semiconductor device 1, an Si substrate 2 is used as a semiconductor substrate. A predetermined transistor structure (not shown) is formed in the Si substrate 2 and an interlayer dielectric film 3, such as an $SiO_2$ film or a silicon nitride (SiN) film, is formed on the Si substrate 2. The interlayer dielectric film 3 may have a single-layer structure or have a multilayer structure. An aluminum pad 4 is formed on the interlayer dielectric film 3. The pad 4 is electrically connected to a transistor formed in the Si substrate 2 by a wiring (not shown) or a via (not shown) formed in the interlayer dielectric film 3. A cover film 105, such as an $SiO_2$ film or an SiN film, is formed on the interlayer dielectric film 3 except on part of the surface of the pad 4. A PI film 6 is formed so that it will cover the interlayer dielectric film 3 and the cover film 5. A chip included in the semiconductor device 1 is fabricated in this way.

In the semiconductor device 1 having the WLP structure, a copper rewiring 7 having a predetermined pattern is formed on the pad 4 which is not covered with the cover film 5 or the PI film 6 and on the PI film 6. In addition, a copper dam layer 8 is formed on and near the sides of the PI film 6 which covers the interlayer dielectric film 3 and the cover film 5 at edge portions of the chip. In this case, the dam layer 8 is formed on the top and sides of the PI film 6 and on a scribed region 9 of the Si substrate 2. As described later, the dam layer 8 and, for example, the rewiring 7 can be formed at the same time.

A sealing resin 10 is formed by using epoxy resin, acrylic resin, or the like so that it will cover one surface of the chip. One end of a copper post 11 which is formed as a conductive member for external connection and which pierces through the sealing resin 10 is connected to the rewiring 7. A solder bump 12 which is also formed as a conductive member for external connection is connected to the other end of the post 11.

As stated above, in the semiconductor device 1 the dam layer 8 is formed at the edge portions of the chip between the chip and the sealing resin 10. The dam layer 8 included in the semiconductor device 1 will now be described in more detail.

Figure 2:
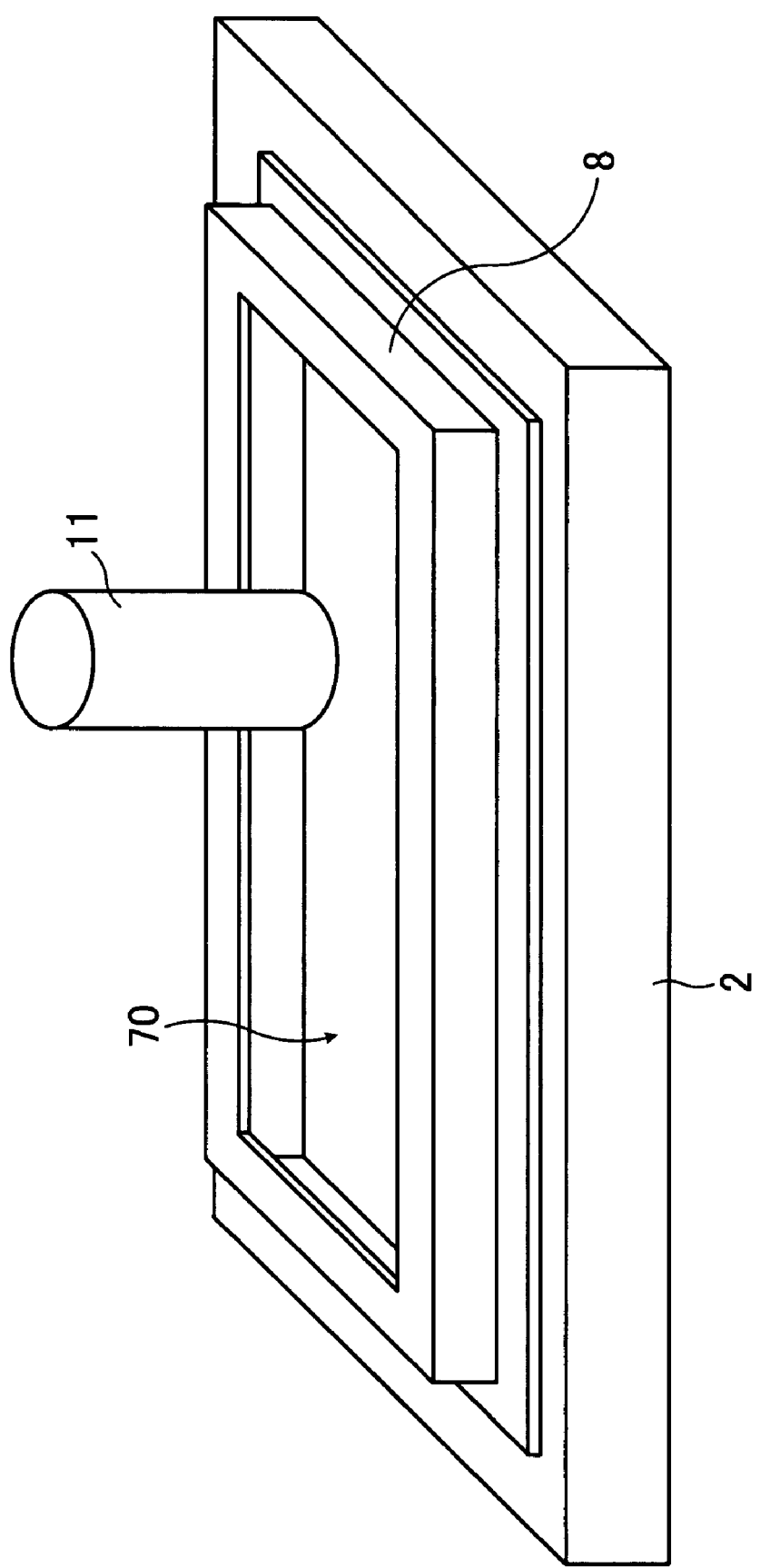
FIG. 2 is a schematic view showing a dam layer included in the semiconductor device according to the first embodiment of the present invention.

FIG. 2 is a schematic view showing the dam layer included in the semiconductor device according to the first embodiment of the present invention. In FIG. 2, the Si substrate 2, the dam layer 8, and the post 11 of the components of the semiconductor device 1 shown in FIG. 1 are shown and the other components are not shown.

As shown in FIG. 1, the dam layer 8 is formed on and near the sides of the PI film 6. As shown in FIG. 2, the dam layer is formed so that it will surround a region (chip region) 70 where the chip is formed on all sides.

A material which adheres well to all of the Si substrate 2, the PI film 6, and the sealing resin 10 compared with the case where the sealing resin 10 is adhered to the Si substrate 2, that is to say, a material the adhesion of which to the Si substrate 2, the PI film 6, and the sealing resin 10 is higher than or equal to a certain level is used for forming the dam layer 8.

As stated above, in the semiconductor device 1 according to the first embodiment of the present invention, the dam layer 8 formed spreads over the PI film 6 and the Si substrate 2. Moreover, firm adhesion is obtained between the dam layer 8 and the PI film 6, between the dam layer 8 and the Si substrate 2, and between the dam layer 8 and the sealing resin 10. This dam layer 8 surrounds the chip on all sides. Therefore, even if a crack runs from a portion on a side of the semiconductor device 1 where the Si substrate 2 and the sealing resin 10 are joined together, the dam layer 8 prevents the crack from reaching the inside. As a result, the peeling of the sealing resin 10 or peeling inside the chip is prevented. Therefore, even if the semiconductor device 1 is in a heating environment, its performance can be maintained.

Furthermore, by performing surface treatment, such as blasting or black oxide coating, on the rewiring 7 or the dam layer 8, adhesion between the rewiring 7 and the sealing resin 10 or between the dam layer 8 and the sealing resin 10 can be increased more. As a result, the peeling of the sealing resin 10 or the like can be prevented more effectively.

In addition, by connecting the dam layer 8 to a ground electrode of the semiconductor device 1, a shielding effect can be obtained.

In the above example, the end on the Si substrate 2 of the dam layer 8 is inside the sealing resin 10 from the side of the semiconductor device 1. However, the end on the Si substrate 2 of the dam layer 8 may be exposed on the side of the semiconductor device 1. In this case, the dam layer 8 on the side of the semiconductor device 1 is between the Si substrate 2 and the sealing resin 10, so the Si substrate 2 and the sealing resin 10 do not touch on any side of the semiconductor device 1. As a result, firm adhesion between the dam layer 8 and the Si substrate 2 and between the dam layer 8 and the sealing resin 10 prevent the appearance of a crack itself.

In the above example, an upper end portion of the post 11 protrudes from the sealing resin 10 to a certain extent. However, only the upper end of the post 11 may get exposed on the sealing resin 10 as long as continuity between the rewiring 7 and the solder bump 12 is secured.

Figure 3:
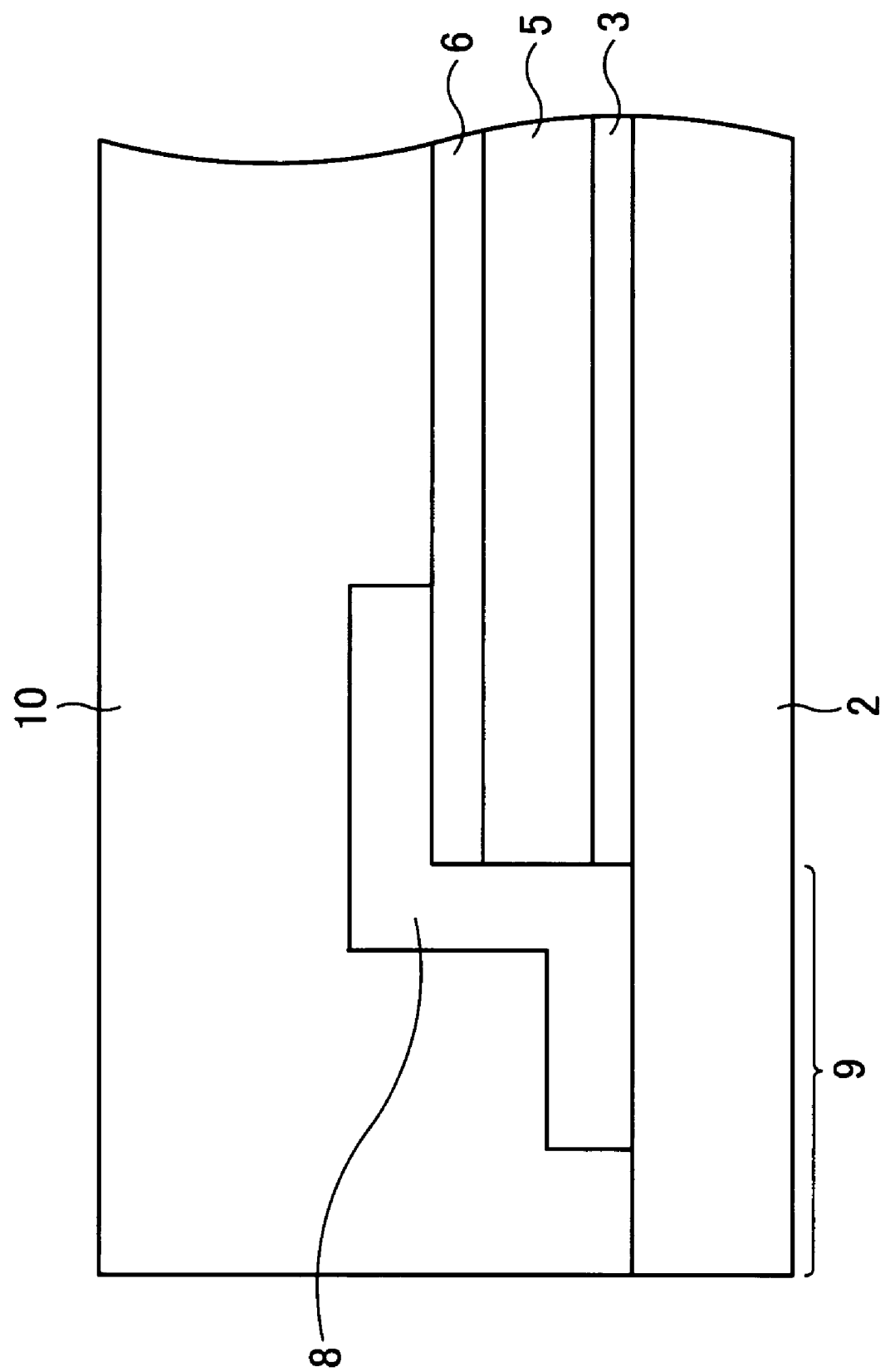
FIG. 3 is a schematic sectional view showing an important part of another example of how to form a PI film.

In the above example, the PI film 6 covers the sides of the interlayer dielectric film 3 and the cover film 5. As shown in FIG. 3, however, the same effect as described above can be obtained even if the PI film 6 does not cover the sides of the interlayer dielectric film 3 and the cover film 5.

FIG. 3 is a schematic sectional view showing an important part of another example of how to form a PI film.

In FIG. 3, the PI film 6 does not cover the sides of the interlayer dielectric film 3 and the cover film 5. That is to say, the PI film 6 is formed only on the top of the cover film 5. In this case, the dam layer 8 which spreads over the top of the PI film 6, the sides of the interlayer dielectric film 3 and the cover film 5, and the scribed region 9 of the Si substrate 2 should be formed. By doing so, the same effect as described above can be obtained. In other words, the peeling of the sealing resin 10 or peeling inside the chip can be prevented.

In the above descriptions, the dam layer 8 is formed by using copper. However, if a certain level or higher of adhesion between the dam layer 8 and the Si substrate 2, between the dam layer 8 and the PI film 6, and between the dam layer 8 and the sealing resin 10 can be secured, there is no limit in principle to materials for the dam layer 8. The same applies to the PI film 6 and the sealing resin 10.

Furthermore, in the above example one pad 4 and one post 11 are formed on one chip. However, a plurality of pads 4 and a plurality of posts 11 may be formed on the chip.

Figure 4:
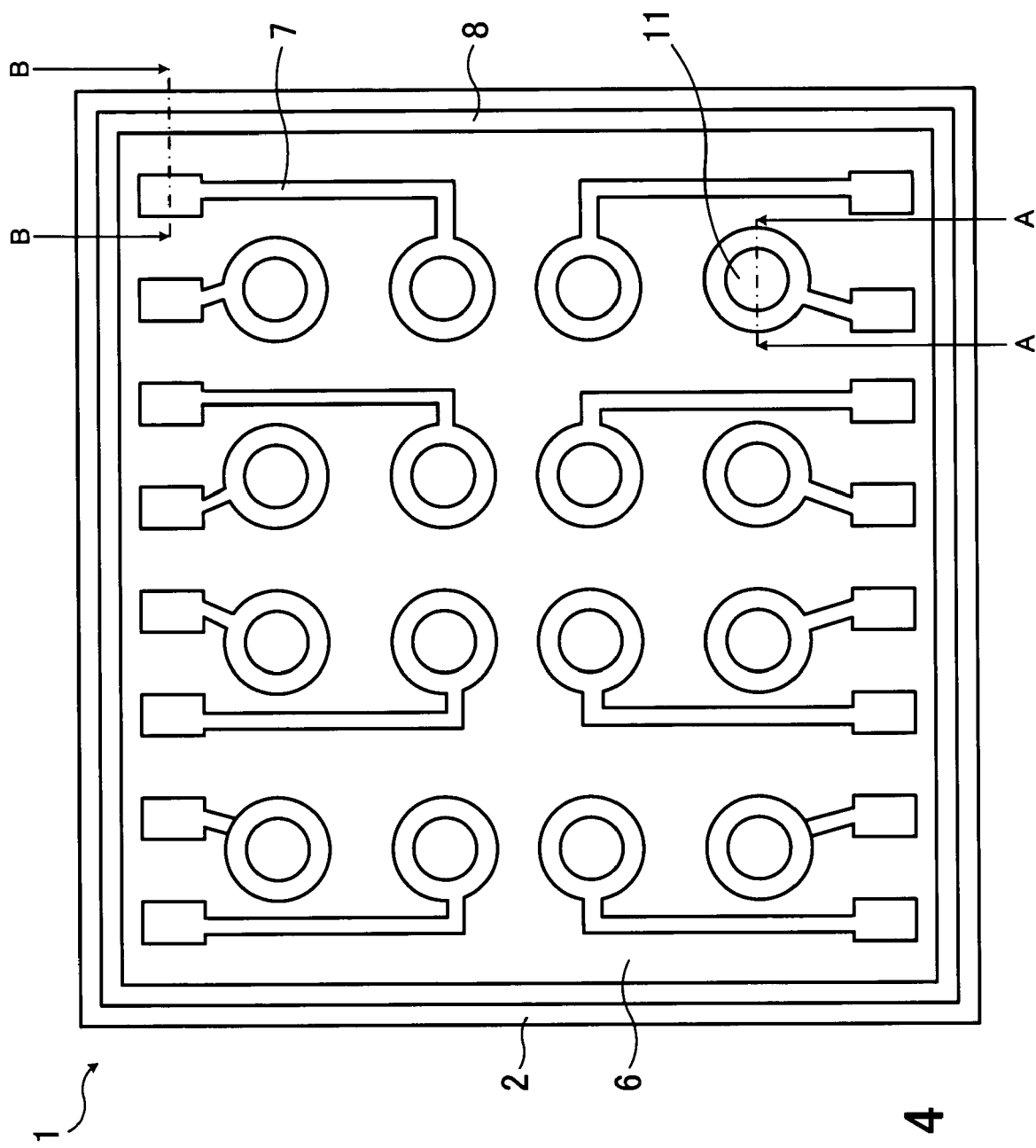
FIG. 4 is a schematic plan view showing an important part of an example of the semiconductor device according to the first embodiment of the present invention.
Figure 5:
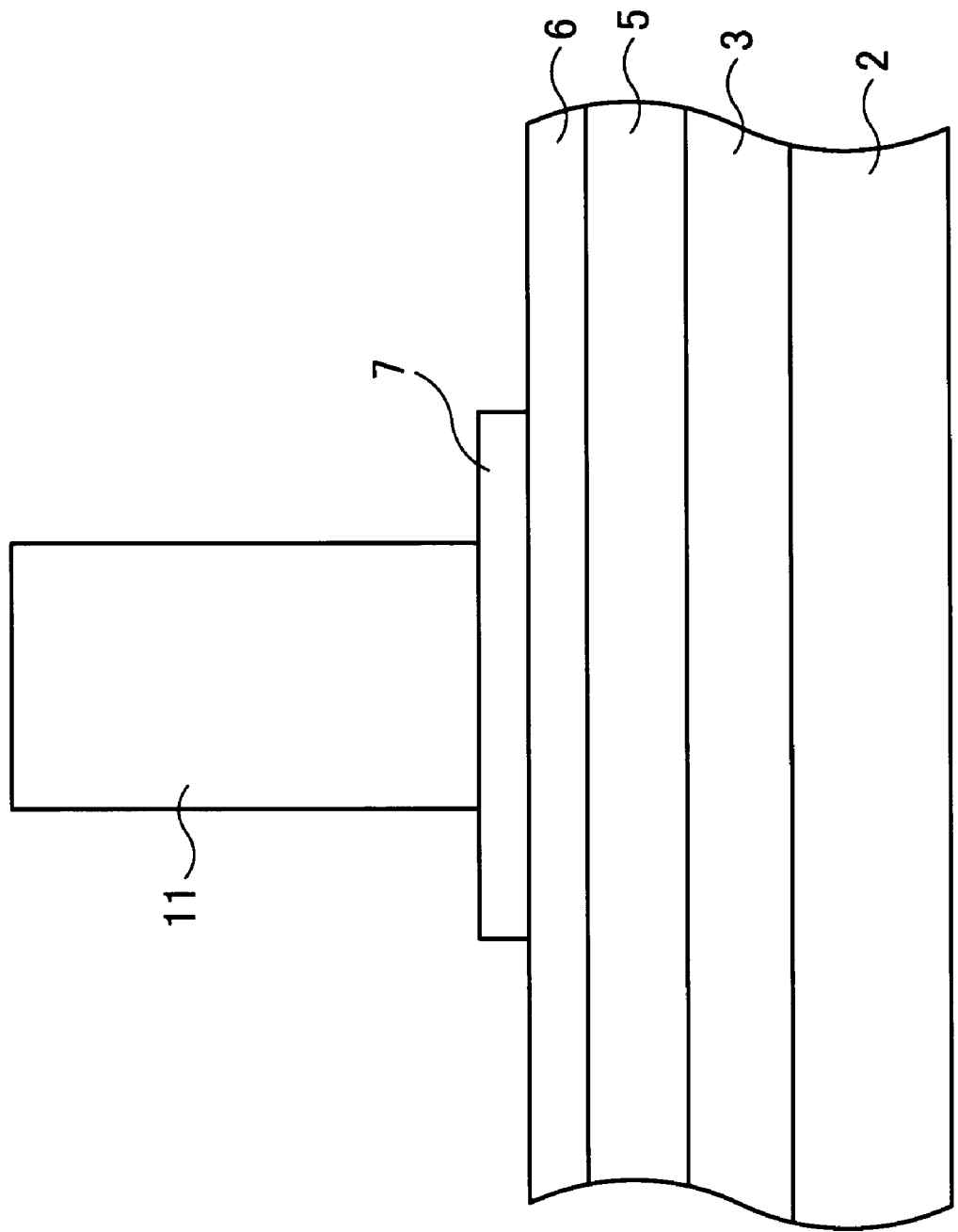
FIG. 5 is a schematic sectional view taken along the line A-A of FIG. 4.
Figure 6:
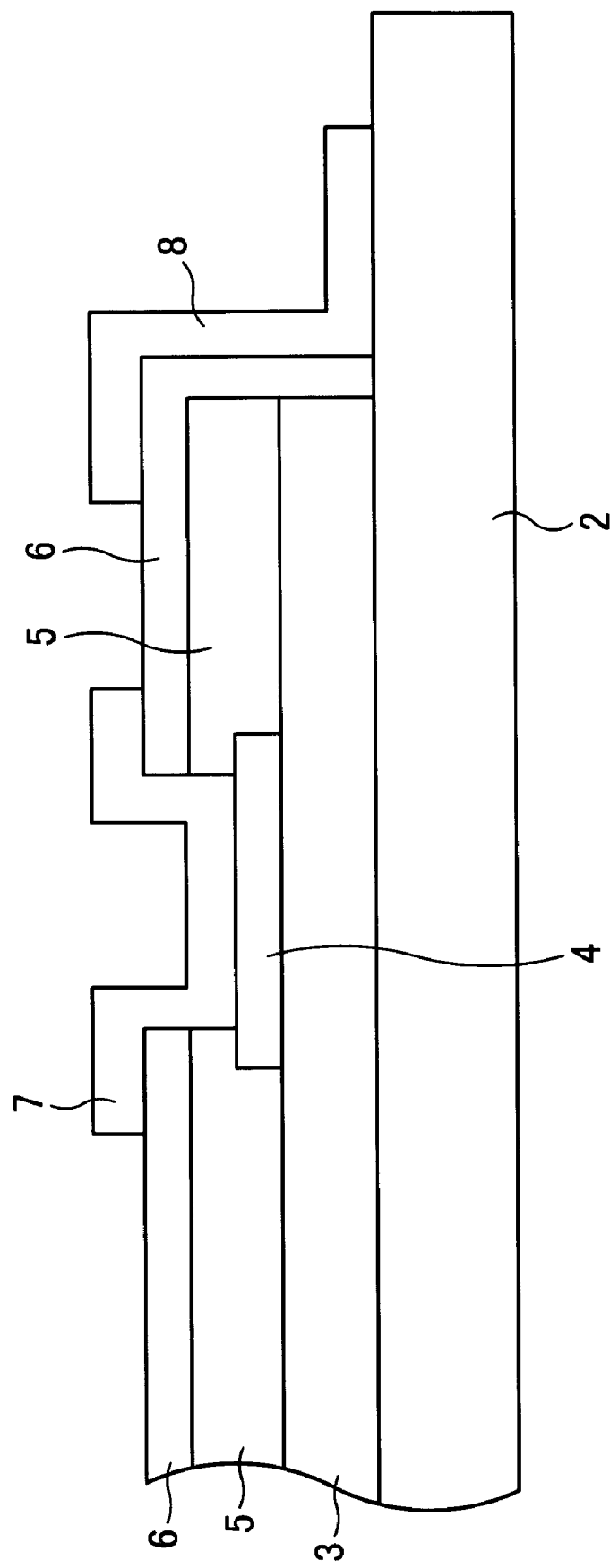
FIG. 6 is a schematic sectional view taken along the line B-B of FIG. 4.

FIG. 4 is a schematic plan view showing an important part of an example of the semiconductor device according to the first embodiment of the present invention. FIG. 5 is a schematic sectional view taken along the line A-A of FIG. 4. FIG. 6 is a schematic sectional view taken along the line B-B of FIG. 4. The sealing resin 10 and the solder bump 12 are not shown in FIGS. 4 through 6.

As shown in FIG. 4, the semiconductor device 1 may include a plurality of posts 11 and a plurality of rewirings 7. In this case, each post 11 is connected to a rewiring 7, as shown in FIG. 5, and each rewiring 7 to which a post 11 is connected is connected to a pad 4, as shown in FIG. 6. As shown in FIGS. 4 and 6, a dam layer 8 is formed so that it will surround a region where the posts 11, the rewirings 7, the pads 4, and the like are formed on all sides.

For convenience of explanation the case where one chip includes one pad 4 and one post 11 will be taken as an example (except a postless structure according to a fifth embodiment of the present invention).

A method for fabricating the semiconductor device 1 according to the first embodiment of the present invention will now be described.

FIGS. 7 through 20 show an example of a method for fabricating the semiconductor device 1 according to the first embodiment of the present invention. A method for fabricating the semiconductor device 1 will be described in order.

Figure 7:
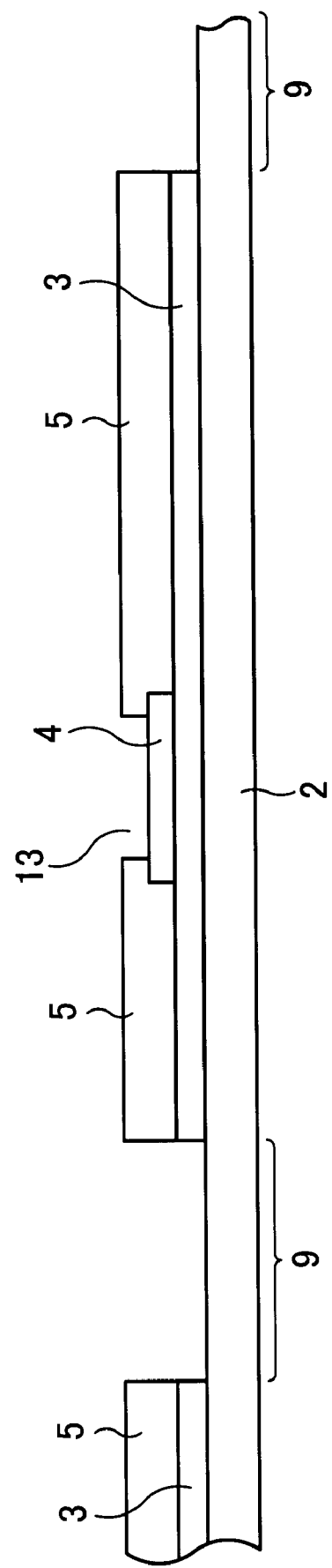
FIG. 7 is a schematic sectional view showing an important part of an opening window formation process.

FIG. 7 is a schematic sectional view showing an important part of an opening window formation process.

In a region in an Si substrate 2 where each chip is to be formed, a transistor structure is formed first by an ordinary method. After that, an interlayer dielectric film 3 is formed, while a wiring and a via required are formed. A pad 4 electrically connected to a transistor is formed. A cover film 5 is then formed. An opening window 13 is formed in the cover film 5 so that part of the surface of the pad 4 will get exposed. In addition, the cover film 5 and the interlayer dielectric film 3 on a scribed region 9 between chips are removed.

Figure 8:
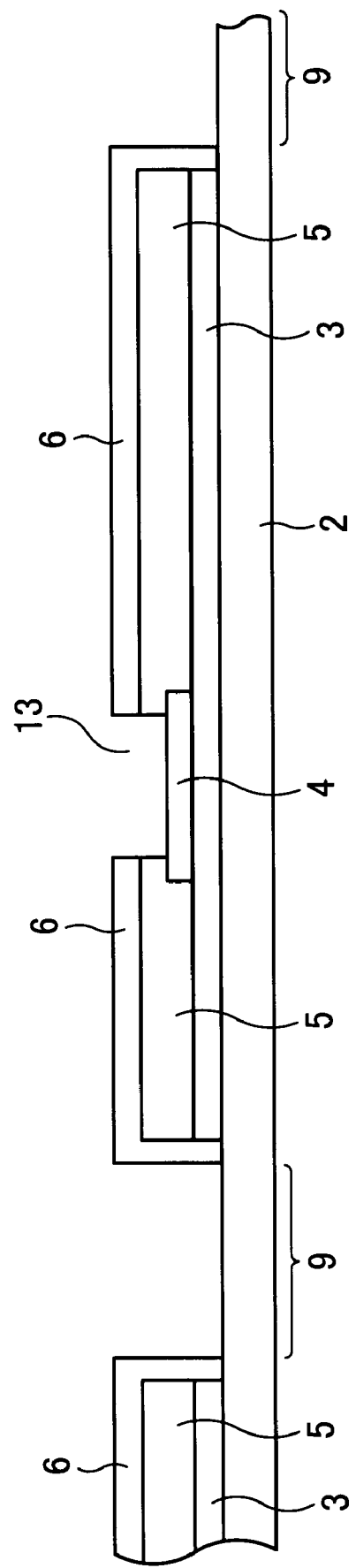
FIG. 8 is a schematic sectional view showing an important part of a PI film formation process.

FIG. 8 is a schematic sectional view showing an important part of a PI film formation process.

After the opening window 13 is formed, an entire surface is coated with polyimide (PI) first to form a PI film 6 with a thickness of about 2 to 10 μm. Patterning is performed on the PI film 6 so that the surface in the opening window 13 of the pad 4 and the surface of the scribed region 9 in the Si substrate 2 will get exposed.

Figure 9:
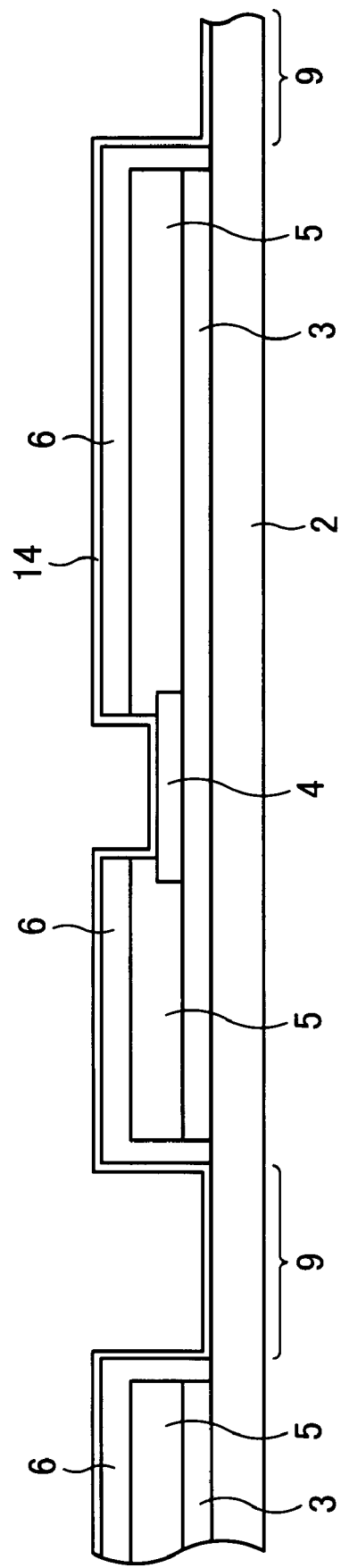
FIG. 9 is a schematic sectional view showing an important part of a seed metal formation process.

FIG. 9 is a schematic sectional view showing an important part of a seed metal formation process.

After patterning is performed on the PI film 6, a seed metal 14 used for forming a rewiring 7 and a dam layer 8 is formed on an entire surface by sputtering. In this case, adhesion between the seed metal 14 and the Si substrate 2 and between the seed metal 14 and the PI film 6 are taken into consideration. Accordingly, for example, sputtering is performed by using titanium (Ti), titanium tungsten (TiW), chromium (Cr), or the like to form a lower layer. Sputtering is then performed by using copper to form an upper layer. These upper and lower layers are used as the seed metal 14. The total thickness of the upper and lower layers should be about 0.2 to 1 μm.

Figure 10:
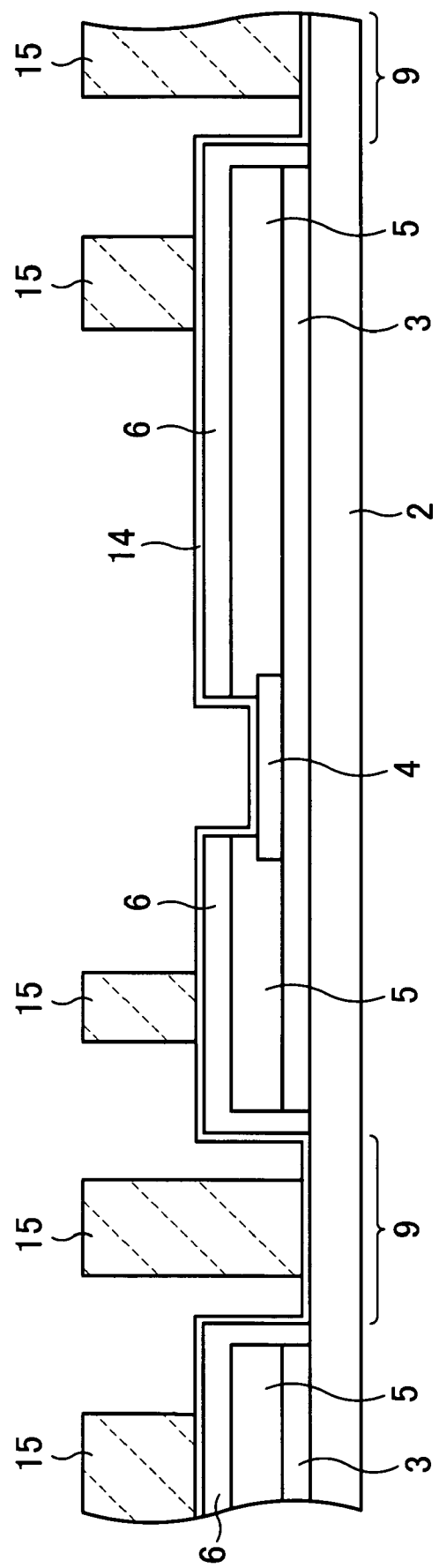
FIG. 10 is a schematic sectional view showing an important part of a rewiring and dam layer resist patterning process.

FIG. 10 is a schematic sectional view showing an important part of a rewiring and dam layer resist patterning process.

After the seed metal 14 is formed, a resist film 15 having a pattern with openings corresponding to regions where the rewiring 7 and the dam layer 8 are to be formed is formed by using a liquid resist or a film resist. That is to say, a portion of the resist film 15 corresponding to the rewiring 7 has a predetermined pattern corresponding to a position where the pad 4 is formed, a position where a post 11 is to be formed, and the like. A portion of the resist film 15 corresponding to the dam layer 8 has a pattern which surrounds a chip on all sides.

Figure 11:
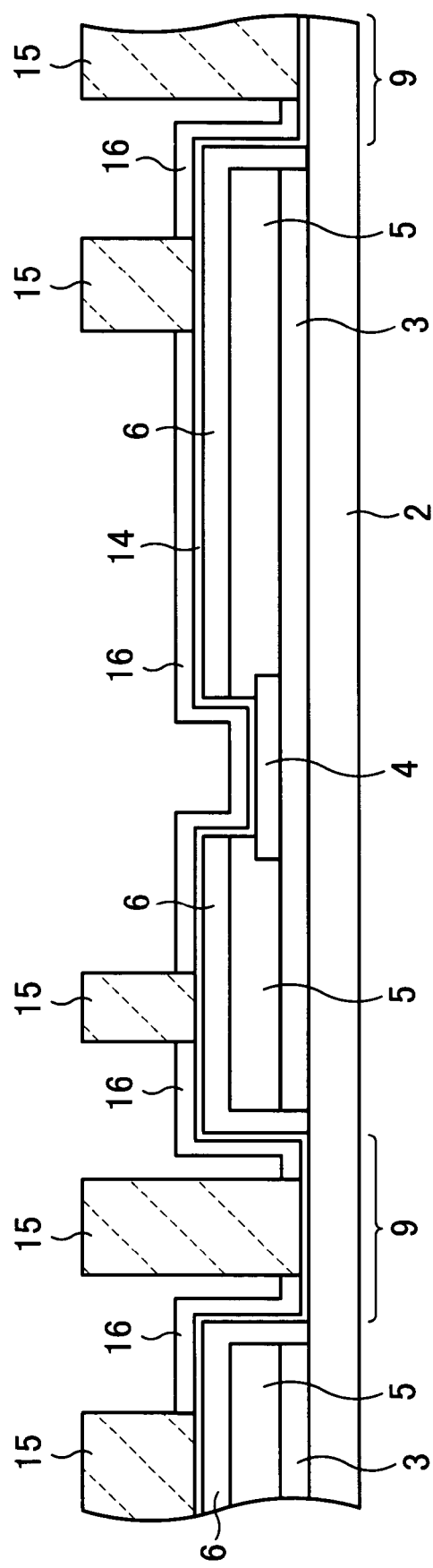
FIG. 11 is a schematic sectional view showing an important part of a rewiring and dam layer formation process.
Figure 12:
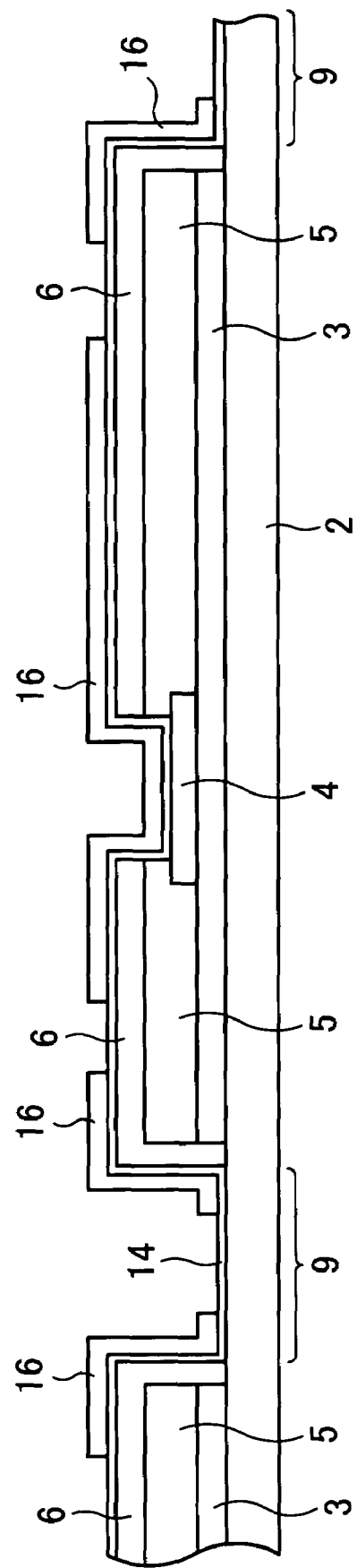
FIG. 12 is a schematic sectional view showing an important part of a first resist stripping process.

FIG. 11 is a schematic sectional view showing an important part of a rewiring and dam layer formation process. FIG. 12 is a schematic sectional view showing an important part of a first resist stripping process.

As shown in FIG. 11, after the resist film 15 is formed, the seed metal 14 is electroplated with the resist film 15 as a mask by using copper to form a copper plating layer 16 with a thickness of about 5 to 10 μm. After the plating layer 16 is formed, the resist film 15 is stripped and a state shown in FIG. 12 is obtained. Surface treatment, such as blasting or black oxide coating, may be performed on the plating layer 16 at an appropriate stage after this electroplating to increase adhesion between the plating layer 16 and a sealing resin 10 to be formed later.

Figure 13:
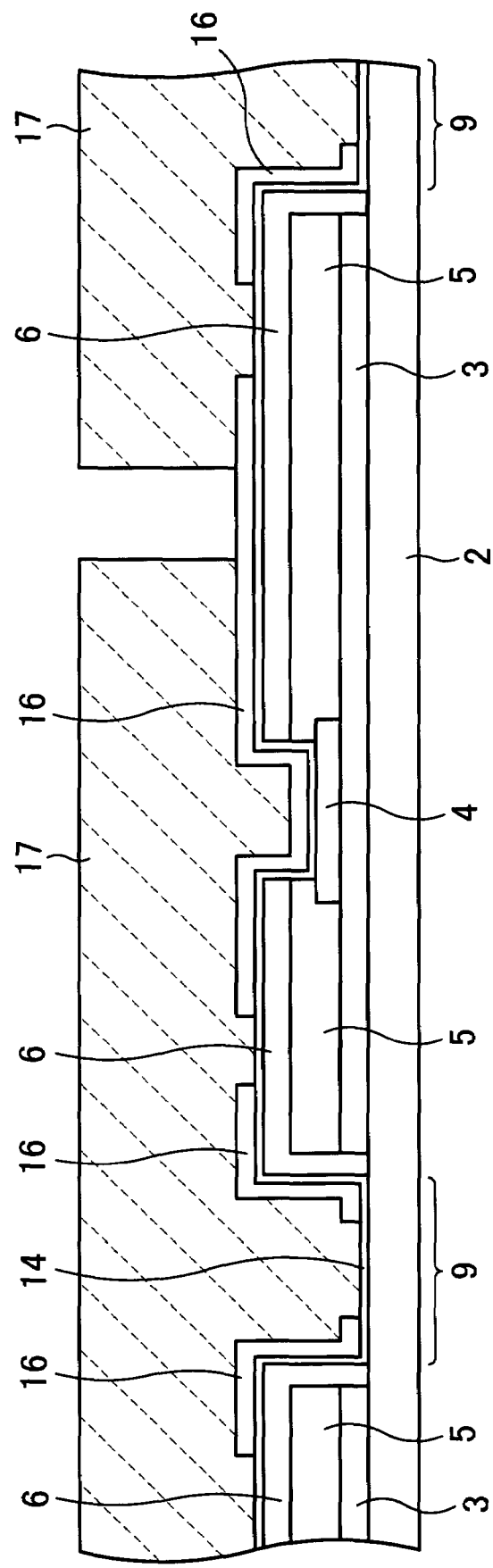
FIG. 13 is a schematic sectional view showing an important part of a post resist patterning process.

FIG. 13 is a schematic sectional view showing an important part of a post resist patterning process.

After the resist film 15 used for forming the plating layer 16 is stripped, a resist film 17 having a pattern with an opening corresponding to a region where the post 11 used for external connection is to be formed is formed by using a liquid resist or a film resist.

Figure 14:
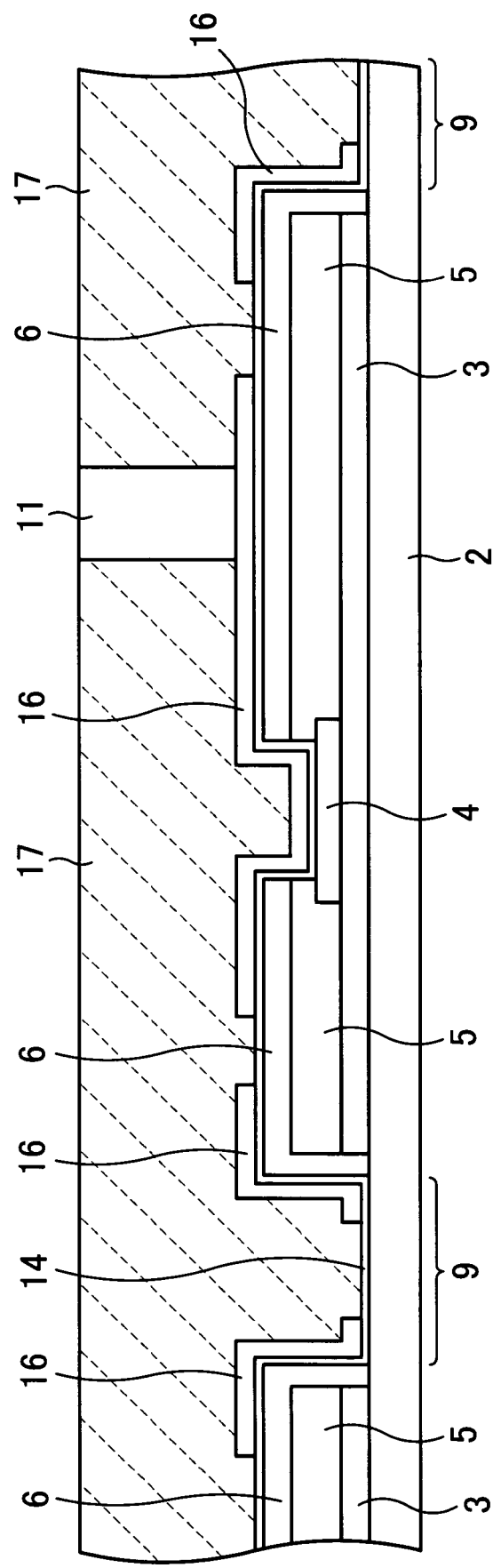
FIG. 14 is a schematic sectional view showing an important part of a post formation process.
Figure 15:
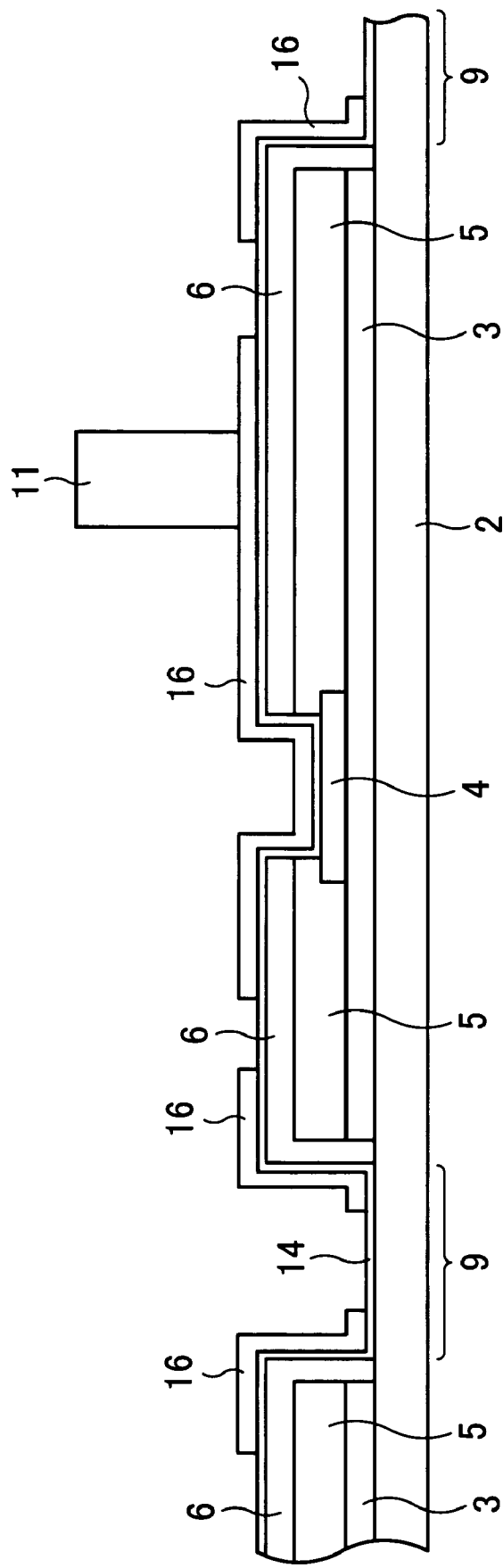
FIG. 15 is a schematic sectional view showing an important part of a second resist stripping process.

FIG. 14 is a schematic sectional view showing an important part of a post formation process. FIG. 15 is a schematic sectional view showing an important part of a second resist stripping process.

As shown in FIG. 14, after the resist film 17 is formed, the plating layer 16 is electroplated with the resist film 17 as a mask by using copper or by using copper, nickel (Ni), and gold (Au) in this order. By doing so, the post 11 with a height of about 50 to 100 μm and a diameter of about 100 μm is formed on the plating layer 16. After the post 11 is formed, the resist film 17 is stripped and a state shown in FIG. 15 is obtained. After the resist film 17 is stripped, surface treatment may be performed on the plating layer 16 and the post 11 in order to increase adhesion between the plating layer 16 and the sealing resin 10 to be formed later and between the post 11 and the sealing resin 10 to be formed later.

Figure 16:
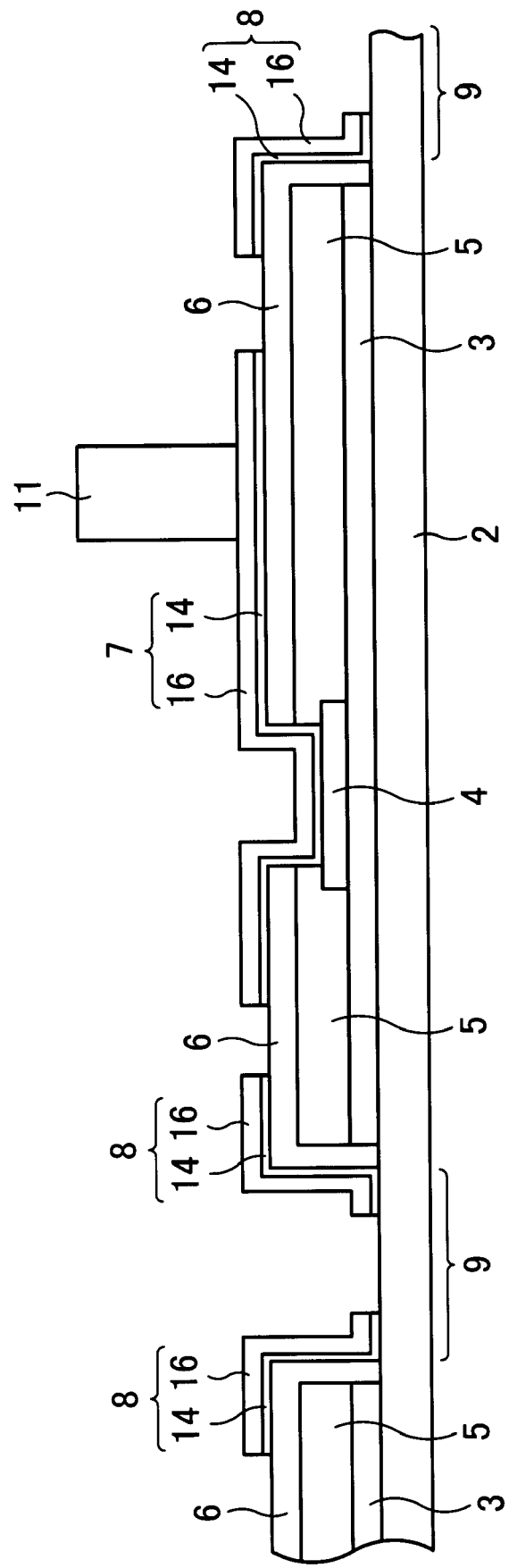
FIG. 16 is a schematic sectional view showing an important part of a seed metal etching process.

FIG. 16 is a schematic sectional view showing an important part of a seed metal etching process.

After the resist film 17 used for forming the post 11 is stripped, the exposed seed metal 14 is removed by etching an entire surface with the plating layer 16 as a mask. By doing so, the seed metal 14 remains only beneath the plating layer 16. As a result, the rewiring 7 and the dam layer 8 each including the seed metal 14 and the plating layer 16 are formed at predetermined positions.

If a metal material is on a dicing line, a trouble may occur in a dicing process described later. Therefore, as shown in FIG. 16, it is preferable from the viewpoint of fabrication that a region where a metal material, such as the seed metal 14, does not remain should be formed on the scribed region 9 and that a wafer should be diced in such a region.

Figure 17:
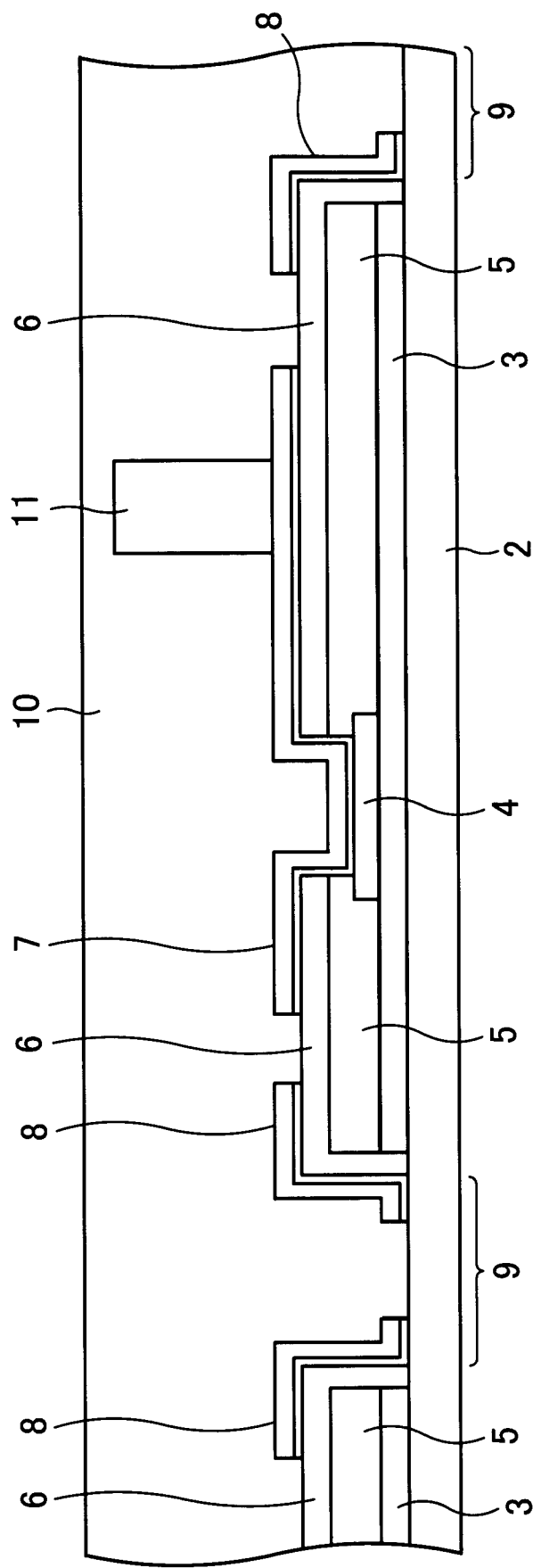
FIG. 17 is a schematic sectional view showing an important part of a sealing resin formation process.

FIG. 17 is a schematic sectional view showing an important part of a sealing resin formation process.

After the seed metal 14 is etched, the sealing resin 10 is formed. The sealing resin 10 may be formed by performing molding with epoxy resin or the like or by coating an entire surface with a liquid resin, such as acrylic resin. In this case, the sealing resin 10 must have sufficient thickness so that all the components including the upper end of the post 11 will be sealed in the sealing resin 10.

Figure 18:
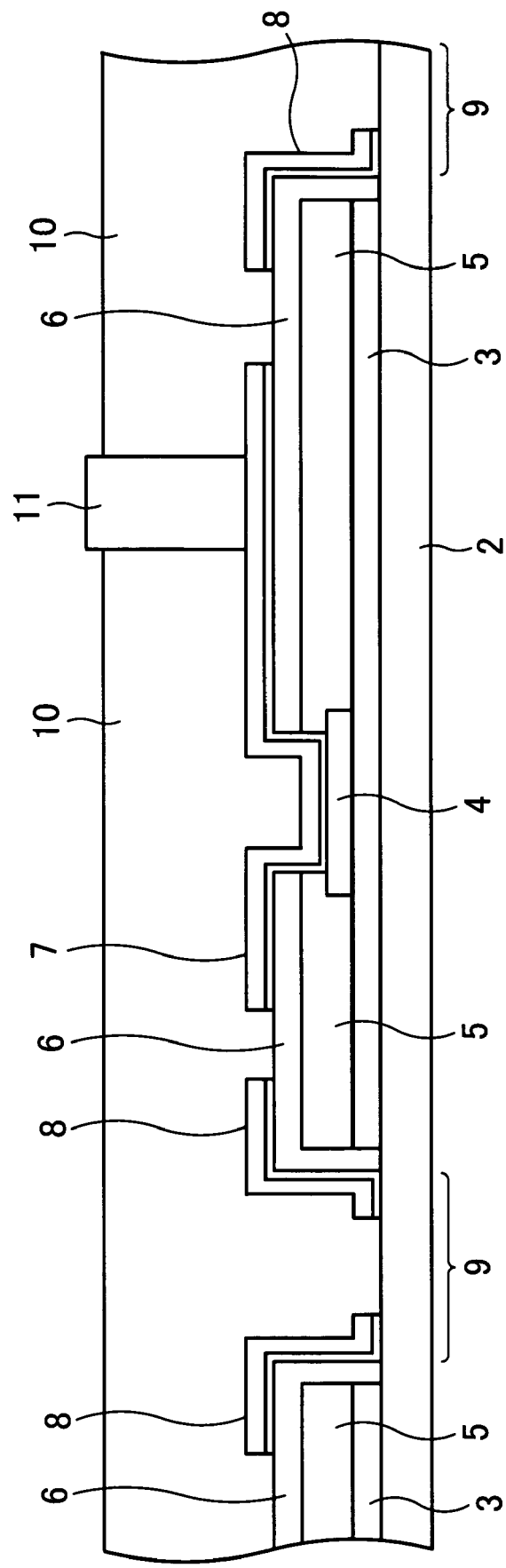
FIG. 18 is a schematic sectional view showing an important part of a post exposure treatment process.

FIG. 18 is a schematic sectional view showing an important part of a post exposure treatment process.

After the sealing resin 10 of predetermined thickness is formed, a process for exposing an upper end portion of the post 11 sealed inside is performed. For example, to expose the upper end portion of the post 11, the sealing resin 10 thickly formed is gradually ground from the surface or the sealing resin 10 is removed by ashing.

Figure 19:
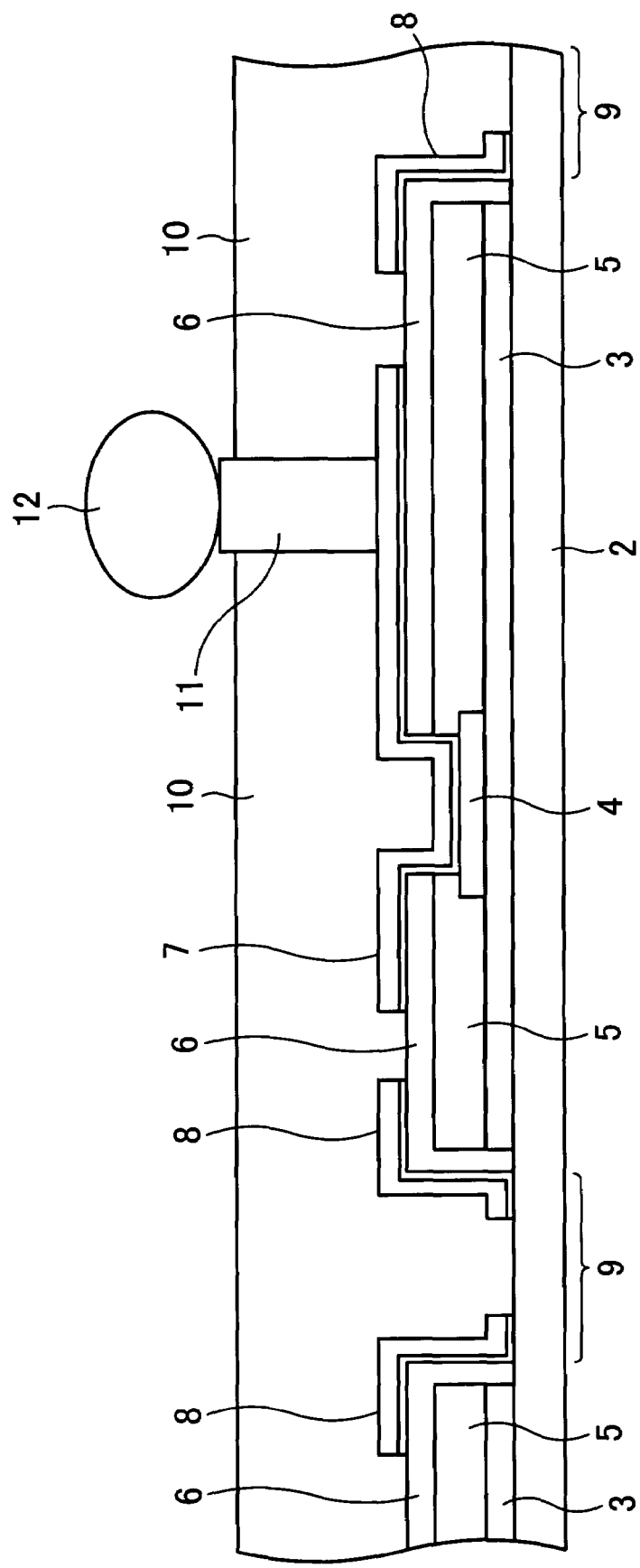
FIG. 19 is a schematic sectional view showing an important part of a solder bump formation process.

FIG. 19 is a schematic sectional view showing an important part of a solder bump formation process.

After the upper end portion of the post 11 is exposed, a solder bump 12 is formed on the exposed portion of the post 11. To form the solder bump 12, a known printing method, a solder ball mounting method, or the like can be used. Reflow is then performed.

Figure 20:
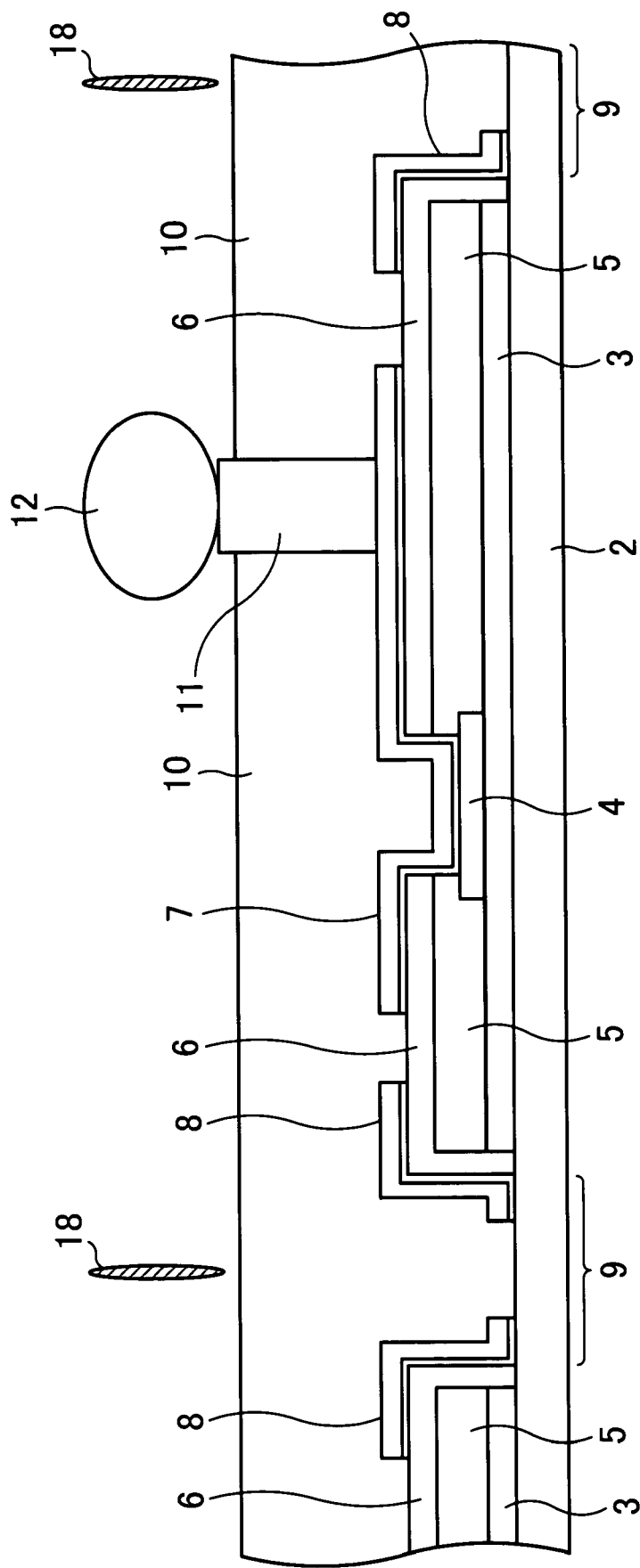
FIG. 20 is a schematic sectional view showing an important part of a dicing process.

FIG. 20 is a schematic sectional view showing an important part of a dicing process.

After the solder bump 12 is formed, dicing is performed in the scribed region 9 (where a metal material does not exist) with a diamond saw 18 according to an ordinary method. As a result, each semiconductor device 1 having the structure shown in FIG. 1 is obtained (the seed metal 14 included in the rewiring 7 and the dam layer 8 is not shown in FIG. 1, 2, 3, 4, 5, or 6).

By adopting the above method, the rewiring 7 and the dam layer 8 can be formed at the same time. Accordingly, it is possible to form the dam layer 8 with a manufacturing apparatus now used without increasing the number of manufacturing processes. The rewiring 7 and the dam layer 8 may be formed in different processes. In this case, the rewiring 7 and the dam layer 8 can be formed by using different materials.

A second embodiment of the present invention will now be described.

Figure 21:
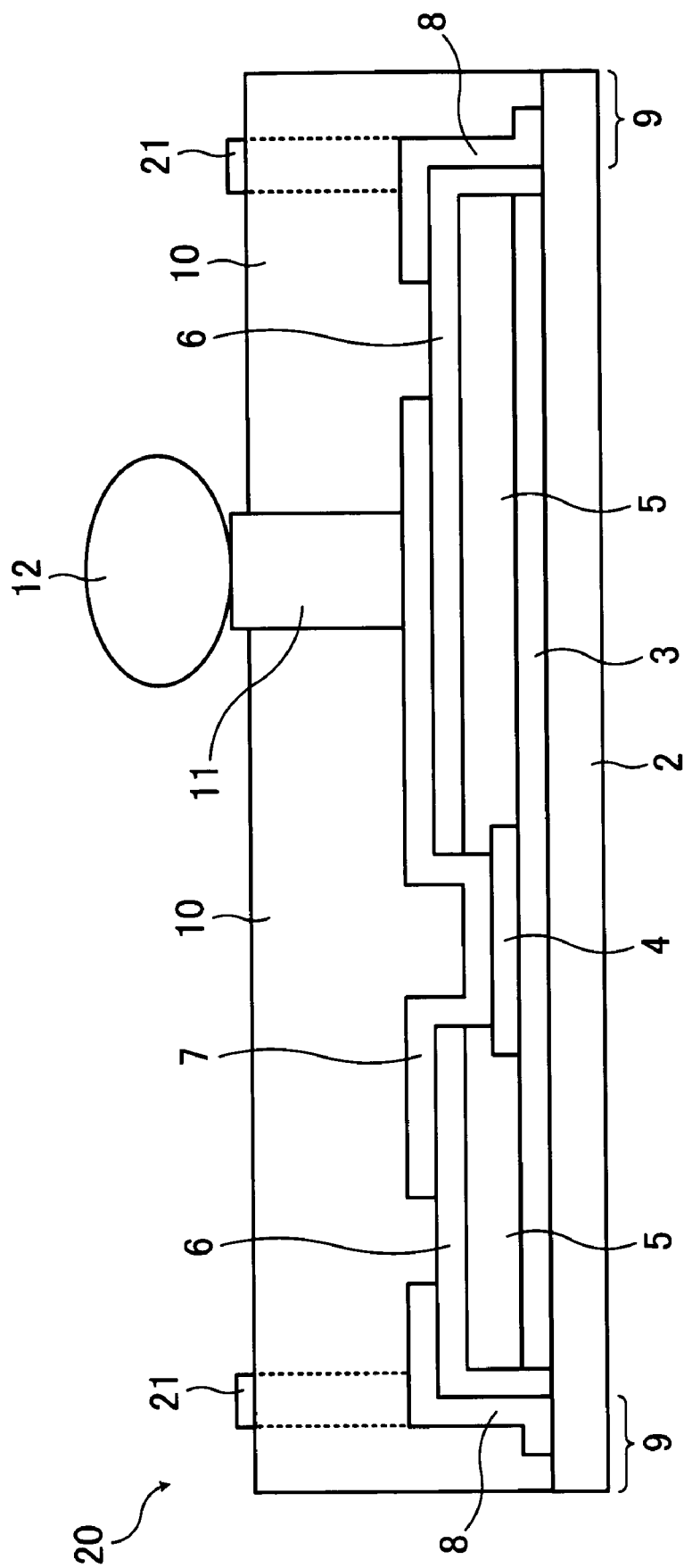
FIG. 21 is a schematic sectional view showing an important part of an example of a semiconductor device according to a second embodiment of the present invention.
Figure 22:
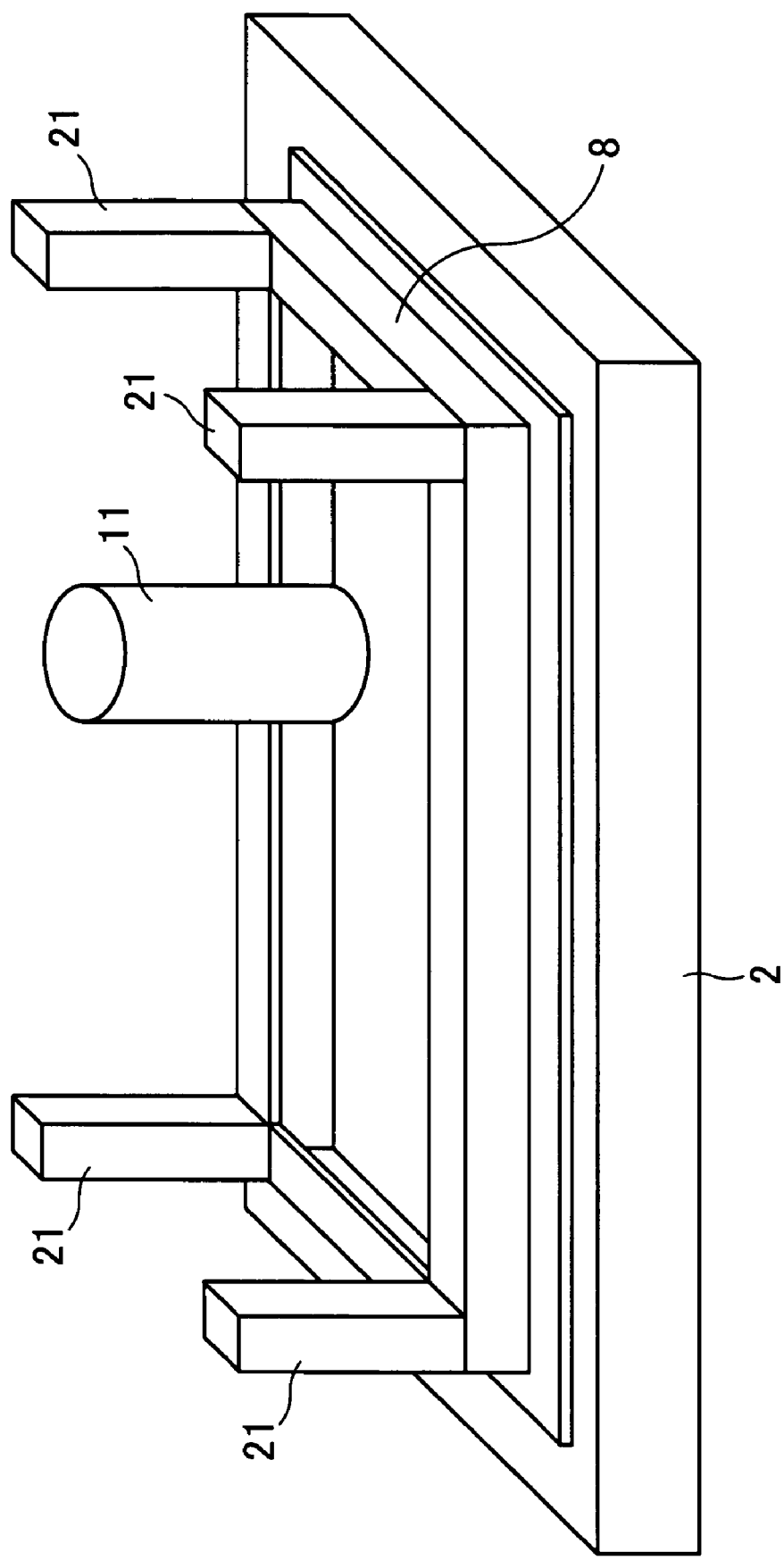
FIG. 22 is a schematic view showing a dam layer included in the semiconductor device according to the second embodiment of the present invention.

FIG. 21 is a schematic sectional view showing an important part of an example of a semiconductor device according to a second embodiment of the present invention. FIG. 22 is a schematic view showing a dam layer included in the semiconductor device according to the second embodiment of the present invention.

Components in FIGS. 21 and 22 that are the same as those shown in FIGS. 1 and 2 are marked with the same symbols and detailed descriptions of them will be omitted. In FIG. 22, only an Si substrate 2, a dam layer 8, and posts 11 and 21 of the components of a semiconductor device 20 shown in FIG. 21 are shown and the other components of the semiconductor device 20 shown in FIG. 21 are not shown.

As shown in FIG. 22, the semiconductor device 20 shown in FIG. 21 differs from the above semiconductor device 1 according to the first embodiment of the present invention in that the posts 21 are formed at positions corresponding to the four corners of a chip on the dam layer 8 which surrounds a chip on all sides.

With the semiconductor device 20 having the above structure, not only the dam layer 8 but also the four posts 21 are formed, so adhesion between the posts 21 and a sealing resin 10 is firm. Therefore, even if the semiconductor device 20 is in a heating environment, thermal stress created in the sealing resin 10 is relieved by the posts 21 and the peeling of the sealing resin 10 is effectively prevented.

With the semiconductor device 20, the dam layer 8 formed surrounds the chip on all sides. Accordingly, the peeling of the sealing resin 10 or peeling inside the chip caused by a crack on the side is prevented. This is the same with the above semiconductor device 1 according to the first embodiment of the present invention.

An example of a method for fabricating the semiconductor device 20 according to the second embodiment of the present invention will now be described.

The processes which are shown in FIGS. 7 through 12 and which are performed for fabricating the above semiconductor device 1 according to the first embodiment of the present invention are also performed for fabricating the semiconductor device 20. Subsequent processes will be described with reference to FIGS. 23 through 30.

Figure 23:
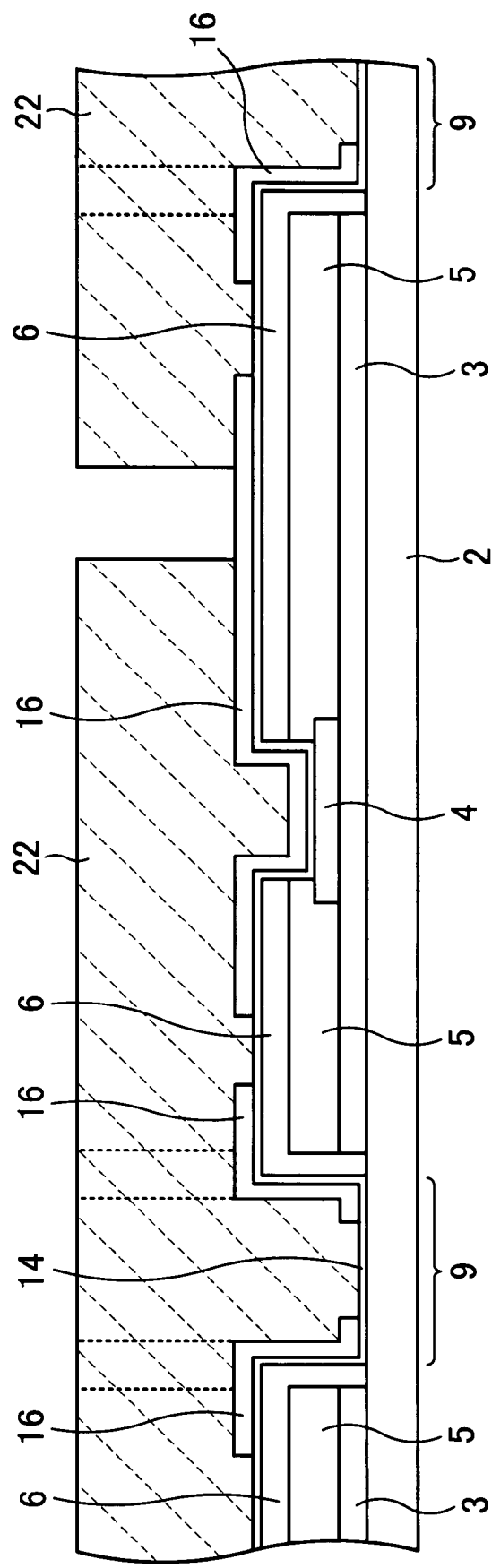
FIG. 23 is a schematic sectional view showing an important part of a post resist patterning process for fabricating the semiconductor device according to the second embodiment of the present invention.

FIG. 23 is a schematic sectional view showing an important part of a post resist patterning process for fabricating the semiconductor device according to the second embodiment of the present invention.

As shown in FIG. 12, a plating layer 16 is formed and a resist film 15 is stripped. A resist film 22 having a pattern with openings corresponding to regions where the posts 11 and 21 are to be formed is then formed by using a liquid resist or a film resist. That is to say, in this example, a resist film 22 having openings at a predetermined position on the plating layer 16 where the post 11 is to be formed and at positions (indicated by dotted lines in FIG. 23) on the plating layer 16 corresponding to the four corners of the chip where the posts 21 are to be formed is formed.

Figure 24:
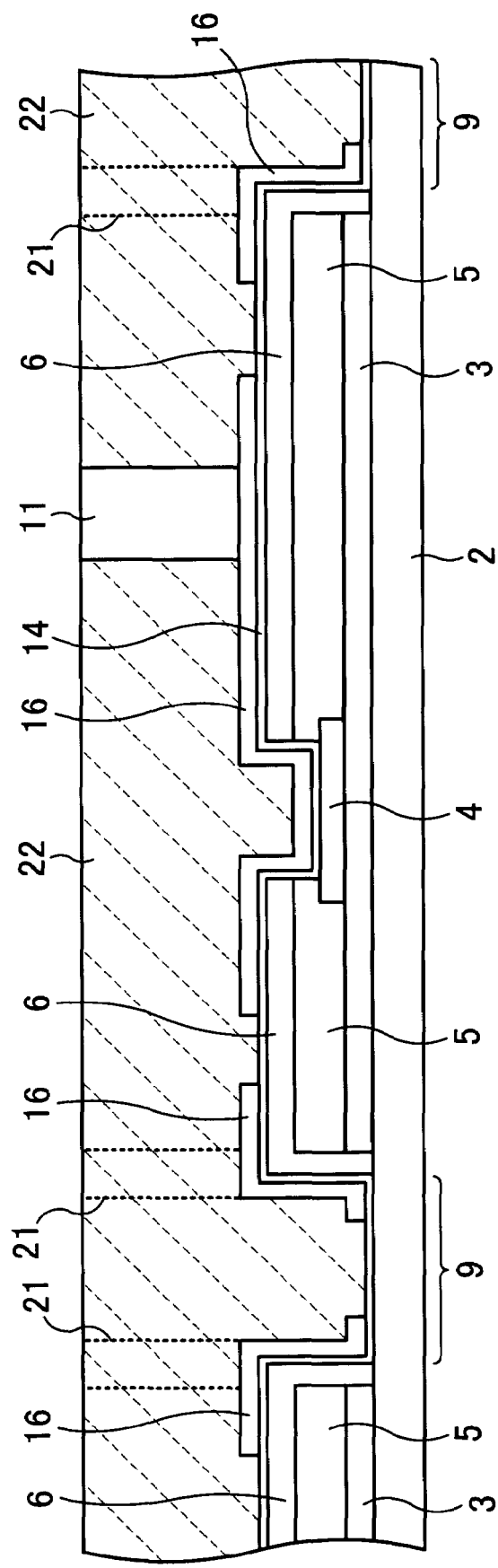
FIG. 24 is a schematic sectional view showing an important part of a post formation process for fabricating the semiconductor device according to the second embodiment of the present invention.
Figure 25:
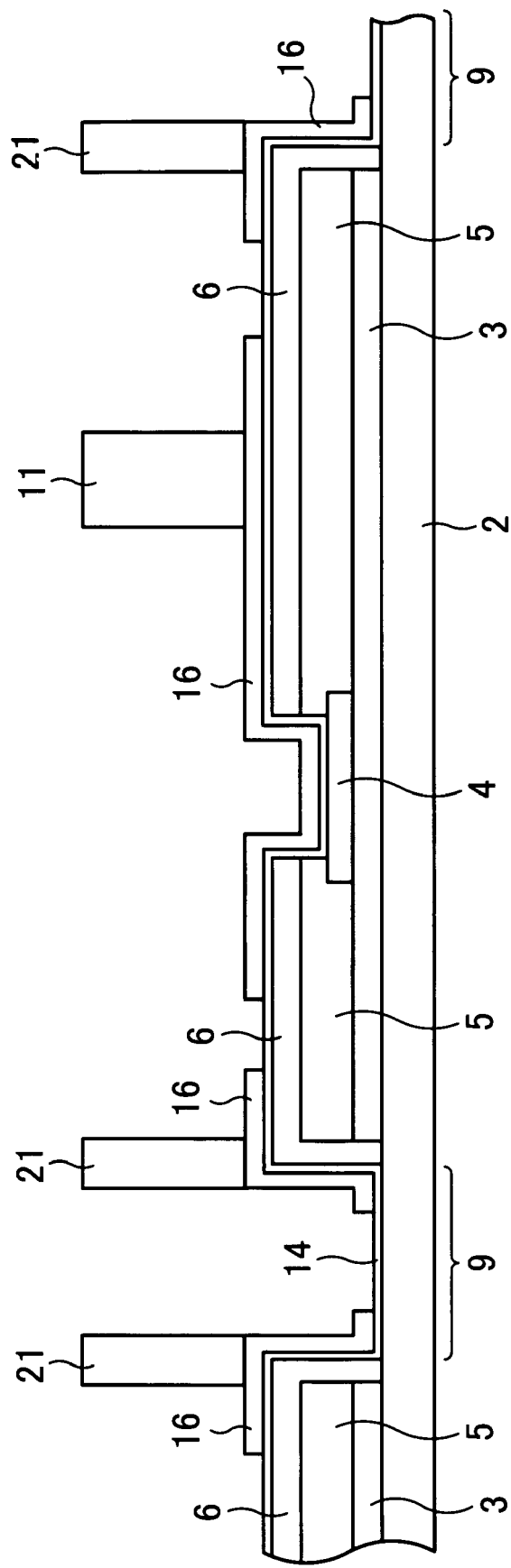
FIG. 25 is a schematic sectional view showing an important part of a second resist stripping process for fabricating the semiconductor device according to the second embodiment of the present invention.

FIG. 24 is a schematic sectional view showing an important part of a post formation process for fabricating the semiconductor device according to the second embodiment of the present invention. FIG. 25 is a schematic sectional view showing an important part of a second resist stripping process for fabricating the semiconductor device according to the second embodiment of the present invention.

As shown in FIG. 24, after the resist film 22 is formed, the plating layer 16 beneath the openings in the resist film 22 is electroplated with the resist film 22 as a mask by using copper or by using copper, nickel (Ni), and gold (Au) in this order. By doing so, the posts 11 and 21 with a height of about 50 to 100 μm are formed on the plating layer 16. After the posts 11 and 21 are formed, the resist film 22 is stripped and a state shown in FIG. 25 is obtained. After the resist film 22 is stripped, surface treatment may be performed on the plating layer 16 and the posts 11 and 21 in order to increase adhesion between the plating layer 16 and the sealing resin 10 to be formed later, between the post 11 and the sealing resin 10 to be formed later, and between the posts 21 and the sealing resin 10 to be formed later.

After the posts 11 and 21 are formed in this way, the semiconductor device 20 according to the second embodiment of the present invention can be fabricated by the same processes that are performed for fabricating the above semiconductor device 1 according to the first embodiment of the present invention.

Figure 26:
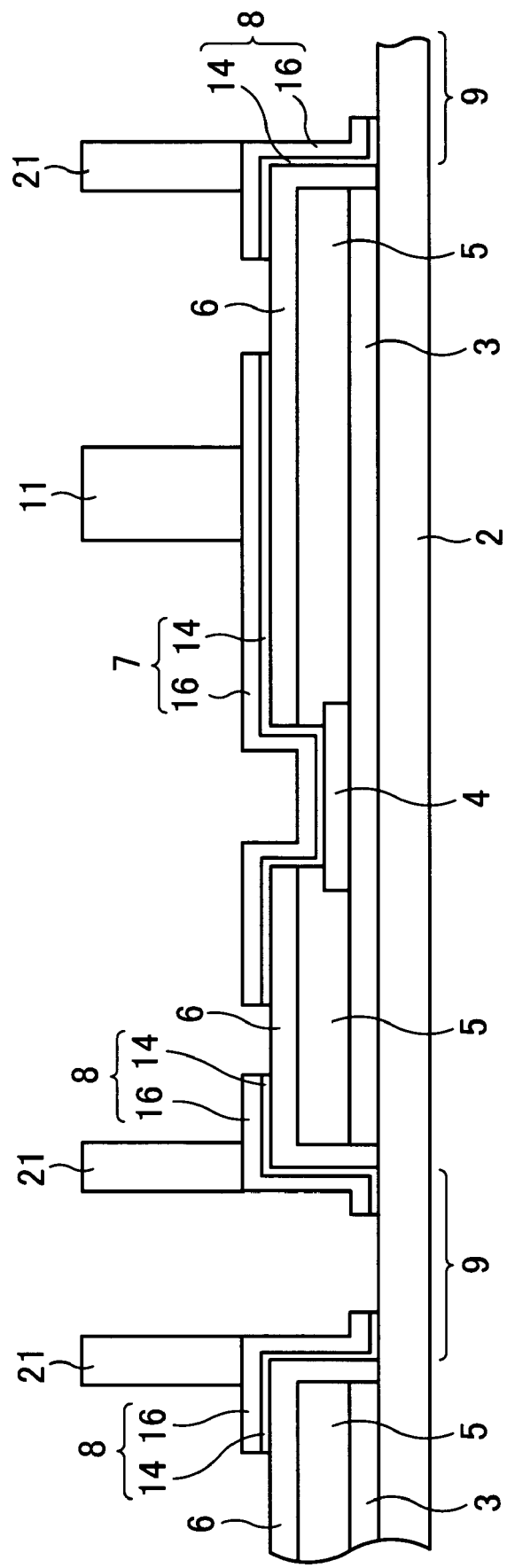
FIG. 26 is a schematic sectional view showing an important part of a seed metal etching process for fabricating the semiconductor device according to the second embodiment of the present invention.
Figure 27:
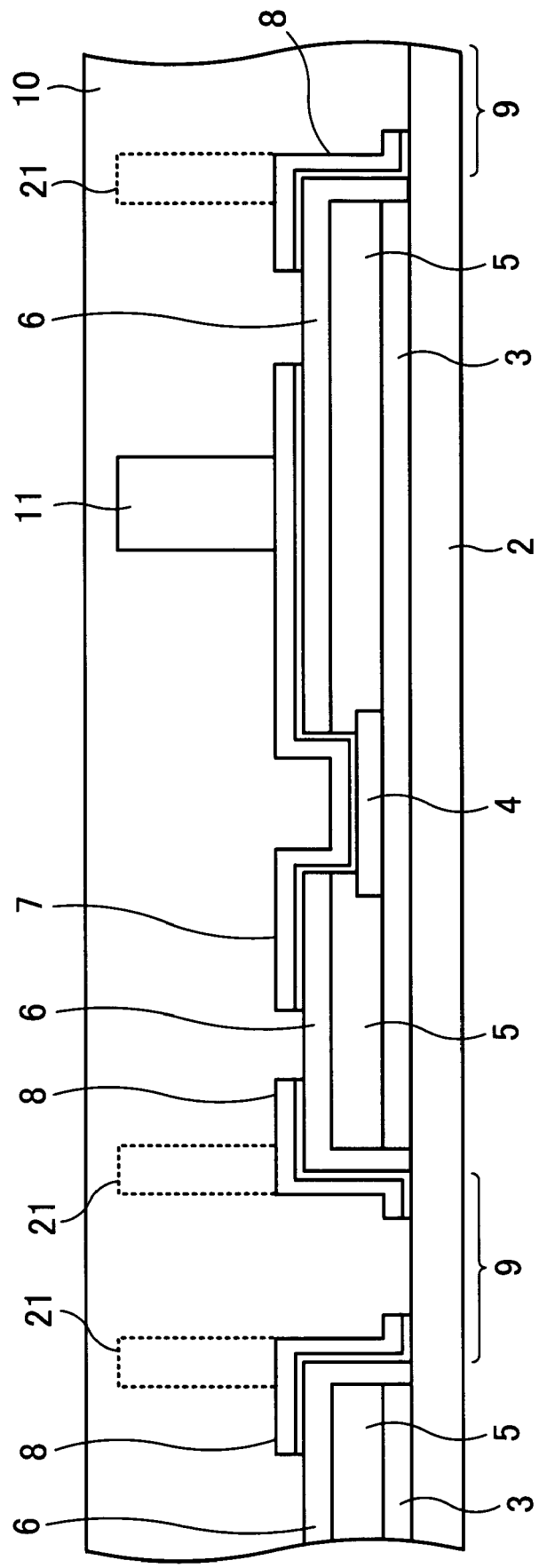
FIG. 27 is a schematic sectional view showing an important part of a sealing resin formation process for fabricating the semiconductor device according to the second embodiment of the present invention.
Figure 28:
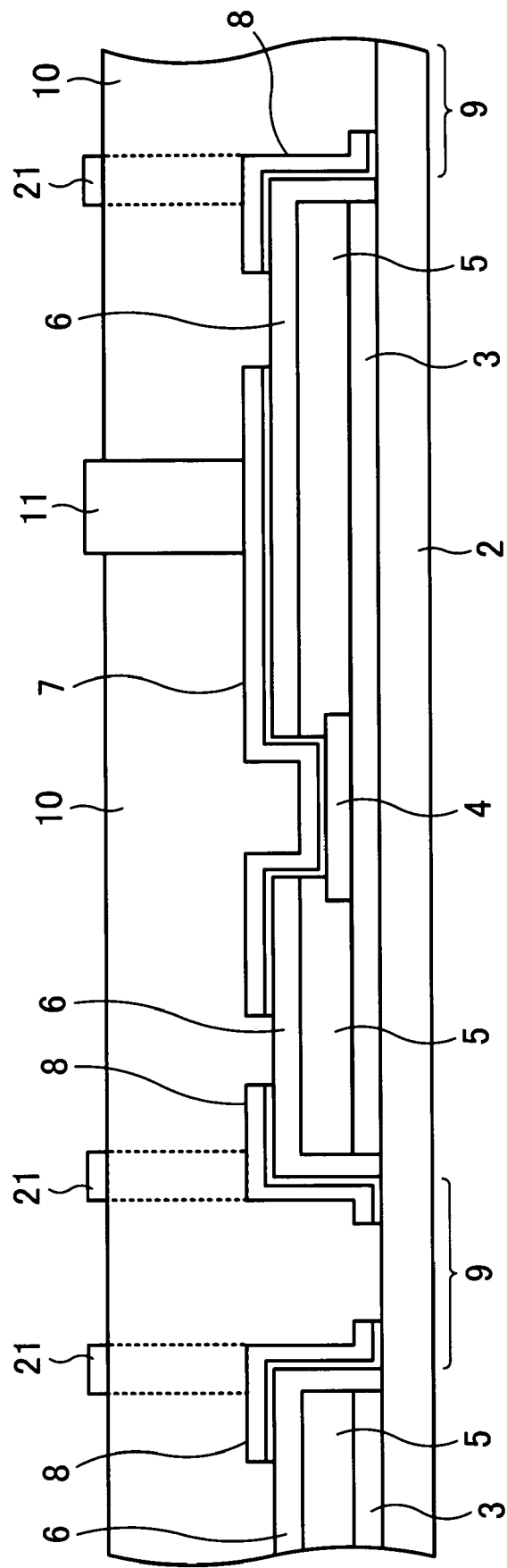
FIG. 28 is a schematic sectional view showing an important part of a post exposure treatment process for fabricating the semiconductor device according to the second embodiment of the present invention.
Figure 29:
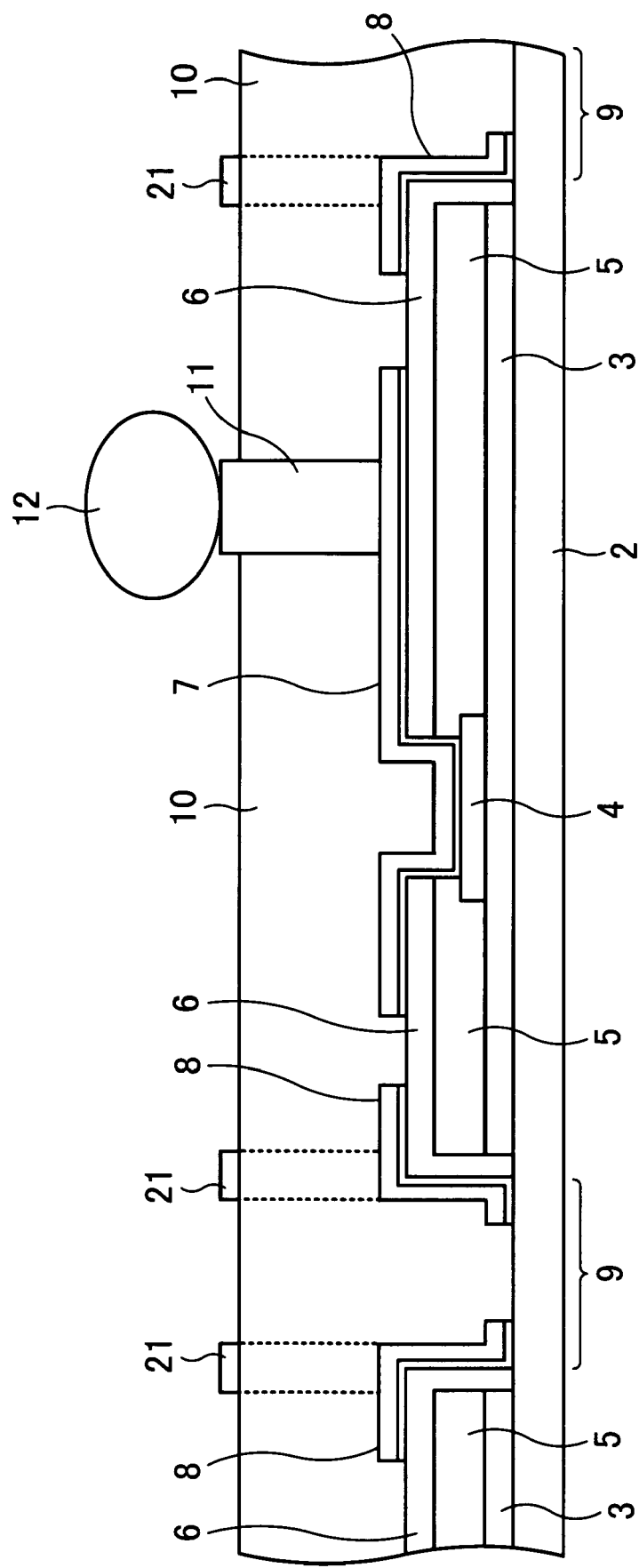
FIG. 29 is a schematic sectional view showing an important part of a solder bump formation process for fabricating the semiconductor device according to the second embodiment of the present invention.
Figure 30:
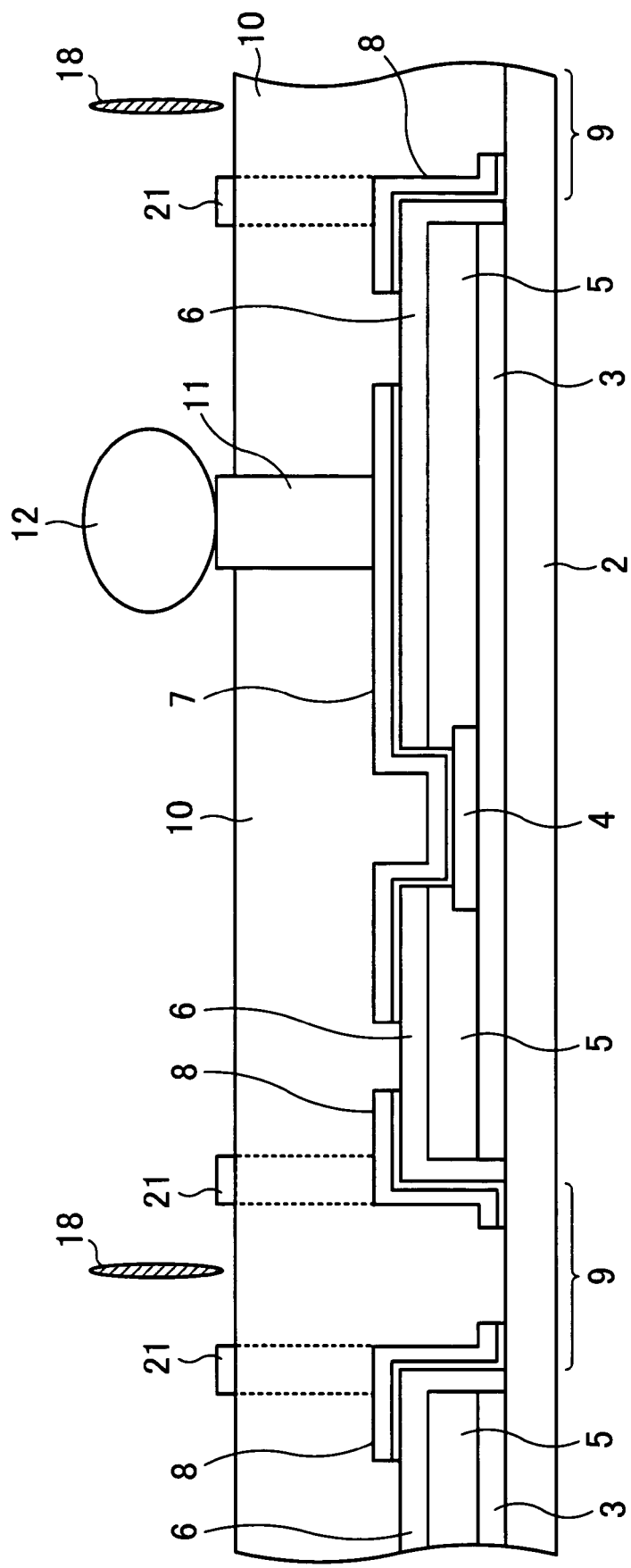
FIG. 30 is a schematic sectional view showing an important part of a dicing process for fabricating the semiconductor device according to the second embodiment of the present invention.

FIG. 26 is a schematic sectional view showing an important part of a seed metal etching process for fabricating the semiconductor device according to the second embodiment of the present invention. FIG. 27 is a schematic sectional view showing an important part of a sealing resin formation process for fabricating the semiconductor device according to the second embodiment of the present invention. FIG. 28 is a schematic sectional view showing an important part of a post exposure treatment process for fabricating the semiconductor device according to the second embodiment of the present invention. FIG. 29 is a schematic sectional view showing an important part of a solder bump formation process for fabricating the semiconductor device according to the second embodiment of the present invention. FIG. 30 is a schematic sectional view showing an important part of a dicing process for fabricating the semiconductor device according to the second embodiment of the present invention.

As shown in FIG. 26, after the resist film 22 used for forming the posts 11 and 21 is stripped, an exposed seed metal 14 is removed first by etching an entire surface with the plating layer 16 and the posts 11 and 21 as masks. As a result, a rewiring 7 and the dam layer 8 each including the seed metal 14 and the plating layer 16 are formed at predetermined positions.

As shown in FIG. 27, the sealing resin 10 is then formed by molding or coating an entire surface with a liquid resin. In this case, the sealing resin 10 must have sufficient thickness so that all the components will be sealed in the sealing resin 10. As shown in FIG. 28, part of the sealing resin 10 is removed by grinding, ashing, or the like in order to expose upper end portions of the posts 11 and 21 sealed inside the sealing resin 10. As shown in FIG. 29, after the upper end portions of the posts 11 and 21 are exposed, a solder bump 12 is formed only on the post 11.

Finally, as shown in FIG. 30, dicing is performed with a diamond saw 18. As a result, each semiconductor device 20 having the structure shown in FIG. 21 is obtained (the seed metal 14 included in the rewiring 7 and the dam layer 8 is not shown in FIG. 21 or 22).

By adopting the above method, the rewiring 7 and the dam layer 8 can be formed at the same time. In addition, the posts 11 and 21 can be formed at the same time. Accordingly, it is possible to form the dam layer 8 and the posts 21 with a manufacturing apparatus now used without increasing the number of manufacturing processes. The rewiring 7 and the dam layer 8 may be formed in different processes. Moreover, the posts 11 and 21 may be formed in different processes.

In the semiconductor device 20 according to the second embodiment of the present invention, the posts 21 are formed at the positions corresponding to the four corners of the chip on the dam layer 8 which surrounds the chip on all sides. However, there is no need to form the posts 21 at the positions corresponding to the four corners of the chip. If a plurality of posts are formed on the dam layer 8 which surrounds the chip on all sides at fixed intervals, the same effect that is obtained by forming the above posts 21 can be achieved.

A third embodiment of the present invention will now be described.

Figure 31:
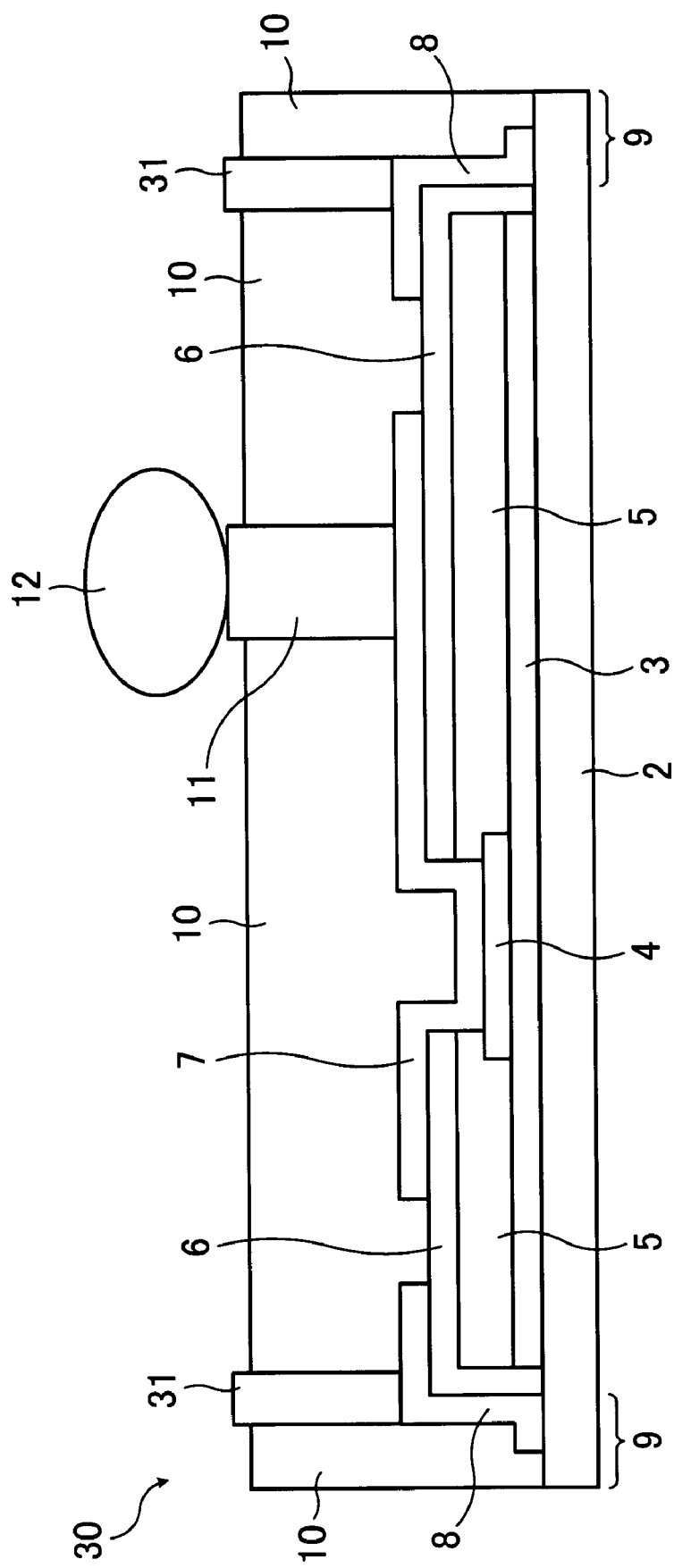
FIG. 31 is a schematic sectional view showing an important part of an example of a semiconductor device according to a third embodiment of the present invention.
Figure 32:
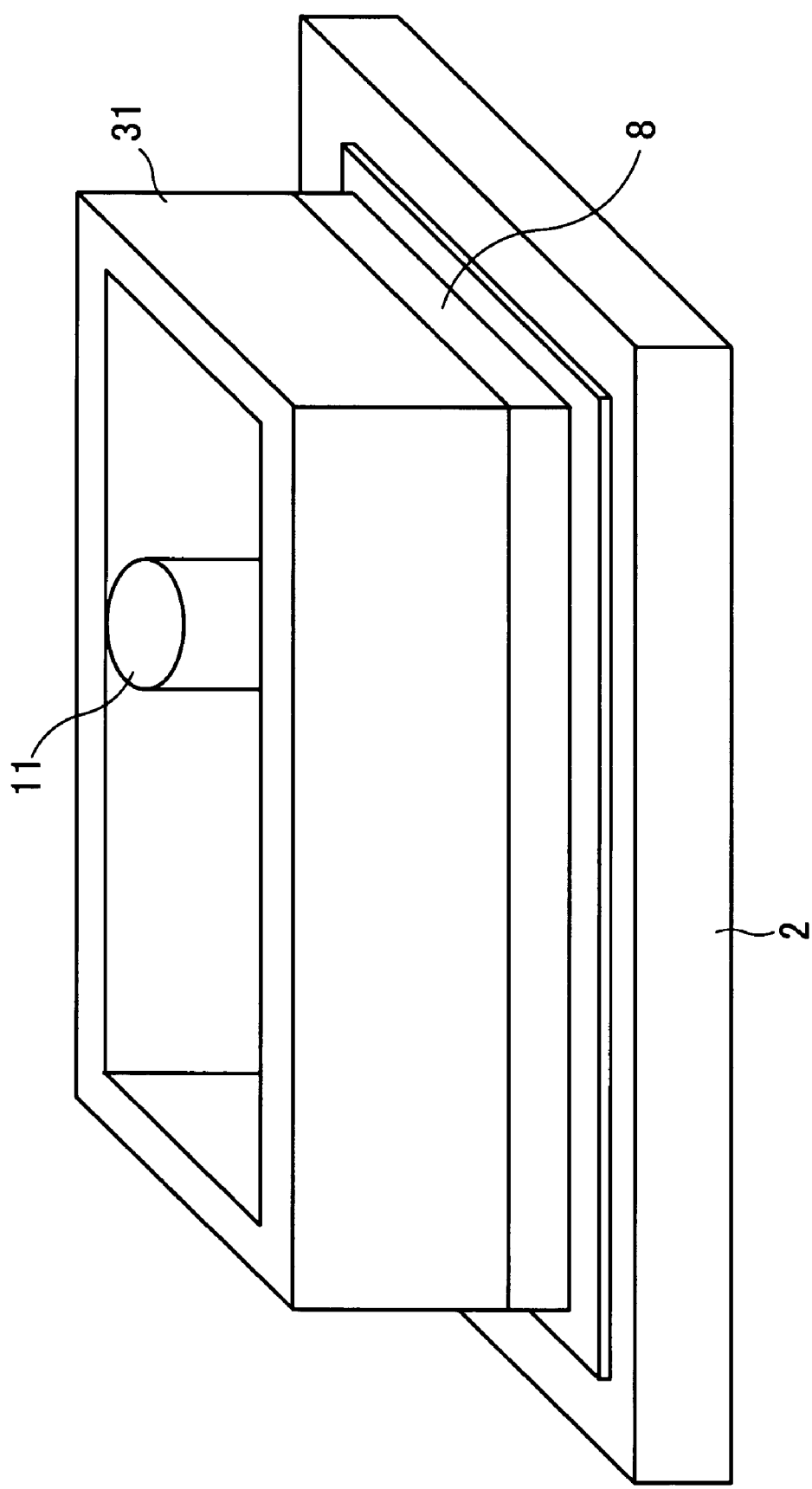
FIG. 32 is a schematic view showing a dam layer included in the semiconductor device according to the third embodiment of the present invention.

FIG. 31 is a schematic sectional view showing an important part of an example of a semiconductor device according to a third embodiment of the present invention. FIG. 32 is a schematic view showing a dam layer included in the semiconductor device according to the third embodiment of the present invention.

Components in FIGS. 31 and 32 that are the same as those shown in FIGS. 1 and 2 are marked with the same symbols and detailed descriptions of them will be omitted. In FIG. 32, only an Si substrate 2, a dam layer 8, and posts 11 and 31 of the components of a semiconductor device 30 shown in FIG. 31 are shown and the other components of the semiconductor device 30 shown in FIG. 31 are not shown.

As shown in FIG. 32, the semiconductor device 30 shown in FIG. 31 differs from the above semiconductor device 1 according to the first embodiment of the present invention in that the post 31 is formed on all of the dam layer 8 which surrounds a chip on all sides.

With the semiconductor device 30 having the above structure, not only the dam layer 8 but also the post 31 is formed, so adhesion between the post 31 and a sealing resin 10 is firm. Therefore, even if the semiconductor device 30 is in a heating environment, the peeling of the sealing resin 10 is effectively prevented.

With the semiconductor device 30, the post 31 formed on all of the dam layer 8 also surrounds the chip on all sides in this way. This increases package strength. As a result, it is very easy to handle the semiconductor device 30 at the time of, for example, picking up with tweezers. Moreover, the post 31 formed in this way prevents a package from warping.

With the semiconductor device 30, the dam layer 8 formed surrounds the chip on all sides. Accordingly, the peeling of the sealing resin 10 or peeling inside the chip caused by a crack on the side is prevented. This is the same with the above semiconductor device 1 according to the first embodiment of the present invention.

An example of a method for fabricating the semiconductor device 30 according to the third embodiment of the present invention will now be described.

The processes which are shown in FIGS. 7 through 12 and which are performed for fabricating the above semiconductor device 1 according to the first embodiment of the present invention are also performed for fabricating the semiconductor device 30. Subsequent processes will be described with reference to FIGS. 33 through 40.

Figure 33:
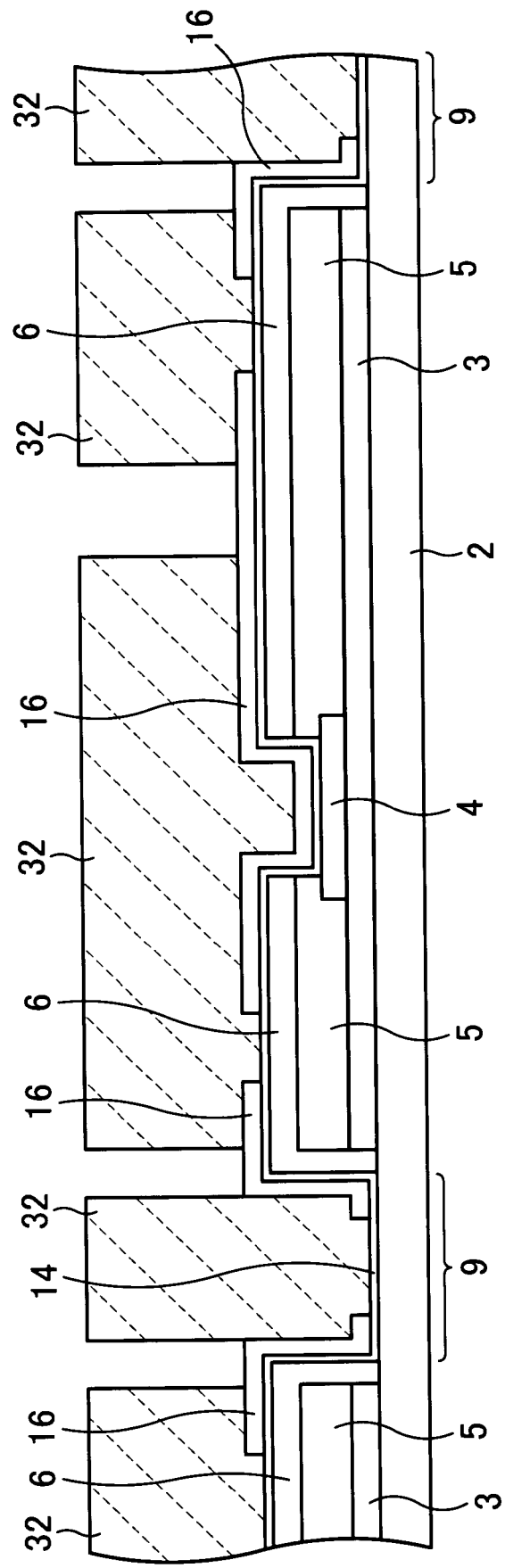
FIG. 33 is a schematic sectional view showing an important part of a post resist patterning process for fabricating the semiconductor device according to the third embodiment of the present invention.

FIG. 33 is a schematic sectional view showing an important part of a post resist patterning process for fabricating the semiconductor device according to the third embodiment of the present invention.

As shown in FIG. 12, a plating layer 16 is formed and a resist film 15 is stripped. A resist film 32 having a pattern with openings corresponding to regions where the posts 11 and 31 are to be formed is then formed. That is to say, in this example, a resist film 32 having openings at a predetermined position on the plating layer 16 where the post 11 is to be formed and at a position on the plating layer 16 where the post 31 which surrounds the chip on all sides is to be formed is formed.

Figure 34:
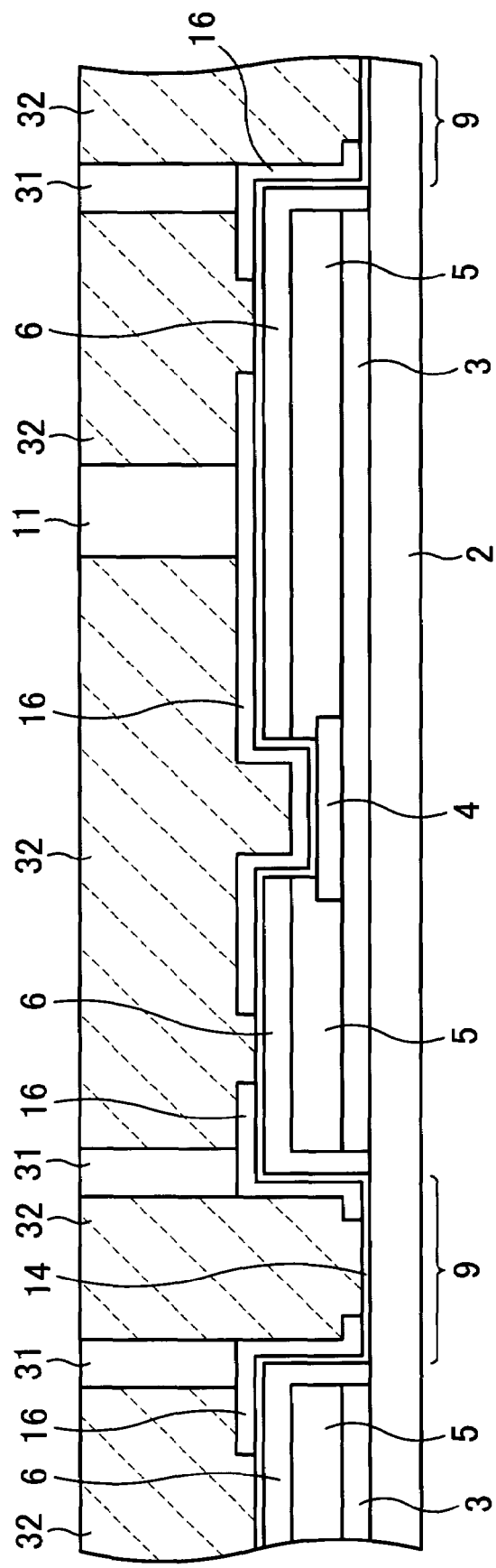
FIG. 34 is a schematic sectional view showing an important part of a post formation process for fabricating the semiconductor device according to the third embodiment of the present invention.
Figure 35:
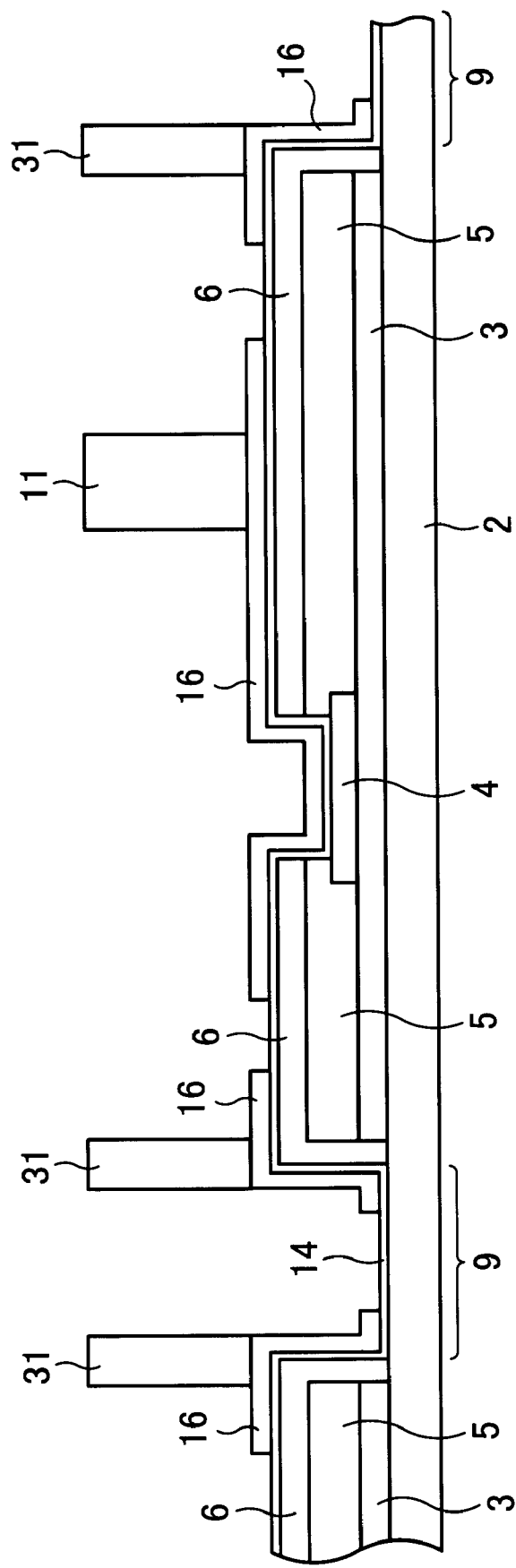
FIG. 35 is a schematic sectional view showing an important part of a second resist stripping process for fabricating the semiconductor device according to the third embodiment of the present invention.

FIG. 34 is a schematic sectional view showing an important part of a post formation process for fabricating the semiconductor device according to the third embodiment of the present invention. FIG. 35 is a schematic sectional view showing an important part of a second resist stripping process for fabricating the semiconductor device according to the third embodiment of the present invention.

As shown in FIG. 34, after the resist film 32 is formed, the plating layer 16 beneath the openings in the resist film 32 is electroplated with the resist film 32 as a mask by using copper or by using copper, nickel (Ni), and gold (Au) in this order. By doing so, the posts 11 and 31 with a height of about 50 to 100 μm are formed on the plating layer 16. After the posts 11 and 31 are formed, the resist film 32 is stripped and a state shown in FIG. 35 is obtained. After the resist film 32 is stripped, surface treatment may be performed on the plating layer 16 and the posts 11 and 31 in order to increase adhesion between the plating layer 16 and the sealing resin 10 to be formed later, between the post 11 and the sealing resin 10 to be formed later, and between the post 31 and the sealing resin 10 to be formed later.

After the posts 11 and 31 are formed in this way, the semiconductor device 30 according to the third embodiment of the present invention can be fabricated by the same processes that are performed for fabricating the above semiconductor device 1 according to the first embodiment of the present invention.

Figure 36:
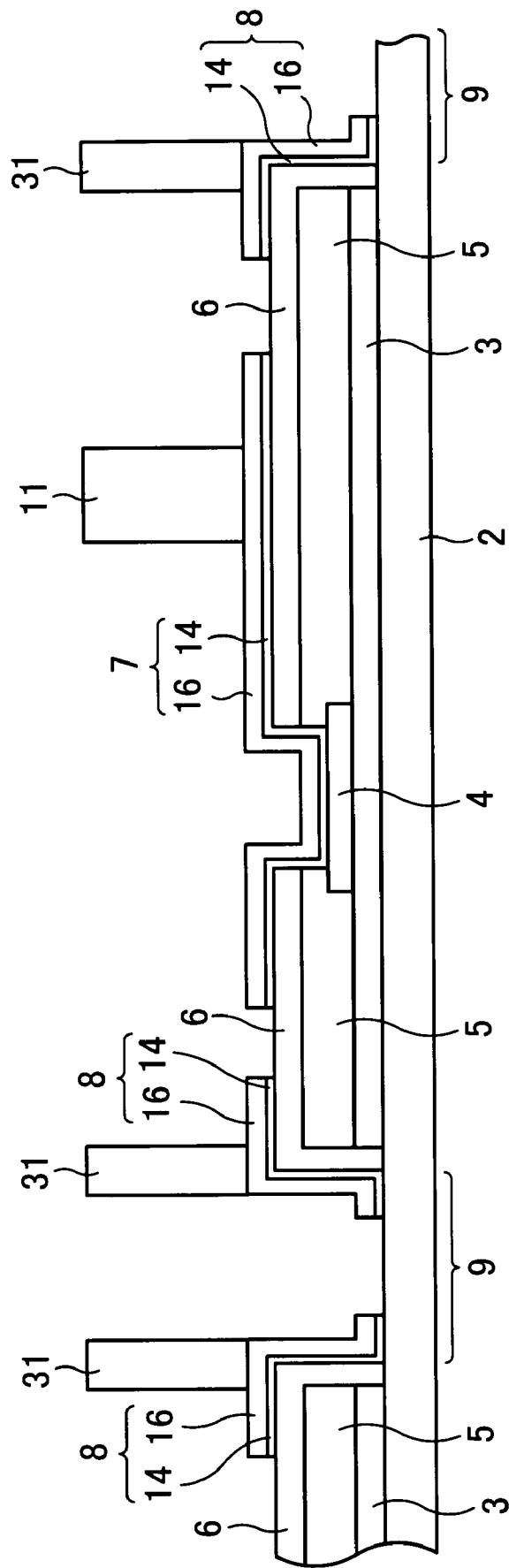
FIG. 36 is a schematic sectional view showing an important part of a seed metal etching process for fabricating the semiconductor device according to the third embodiment of the present invention.
Figure 37:
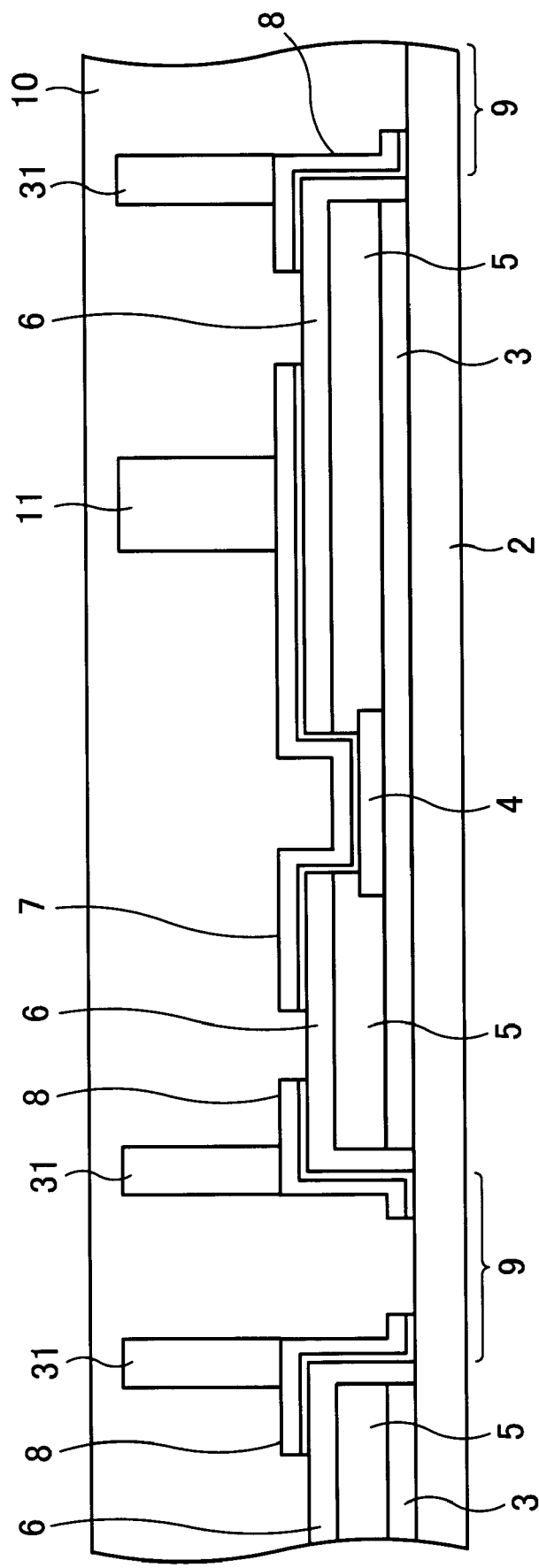
FIG. 37 is a schematic sectional view showing an important part of a sealing resin formation process for fabricating the semiconductor device according to the third embodiment of the present invention.
Figure 38:
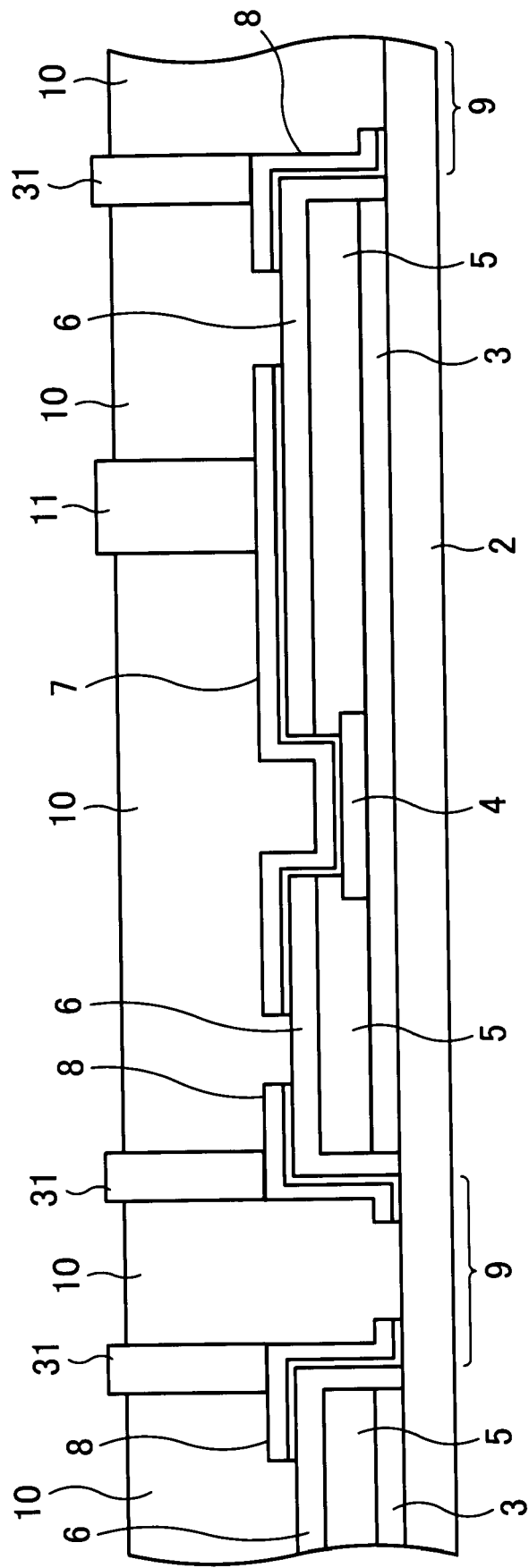
FIG. 38 is a schematic sectional view showing an important part of a post exposure treatment process for fabricating the semiconductor device according to the third embodiment of the present invention.
Figure 39:
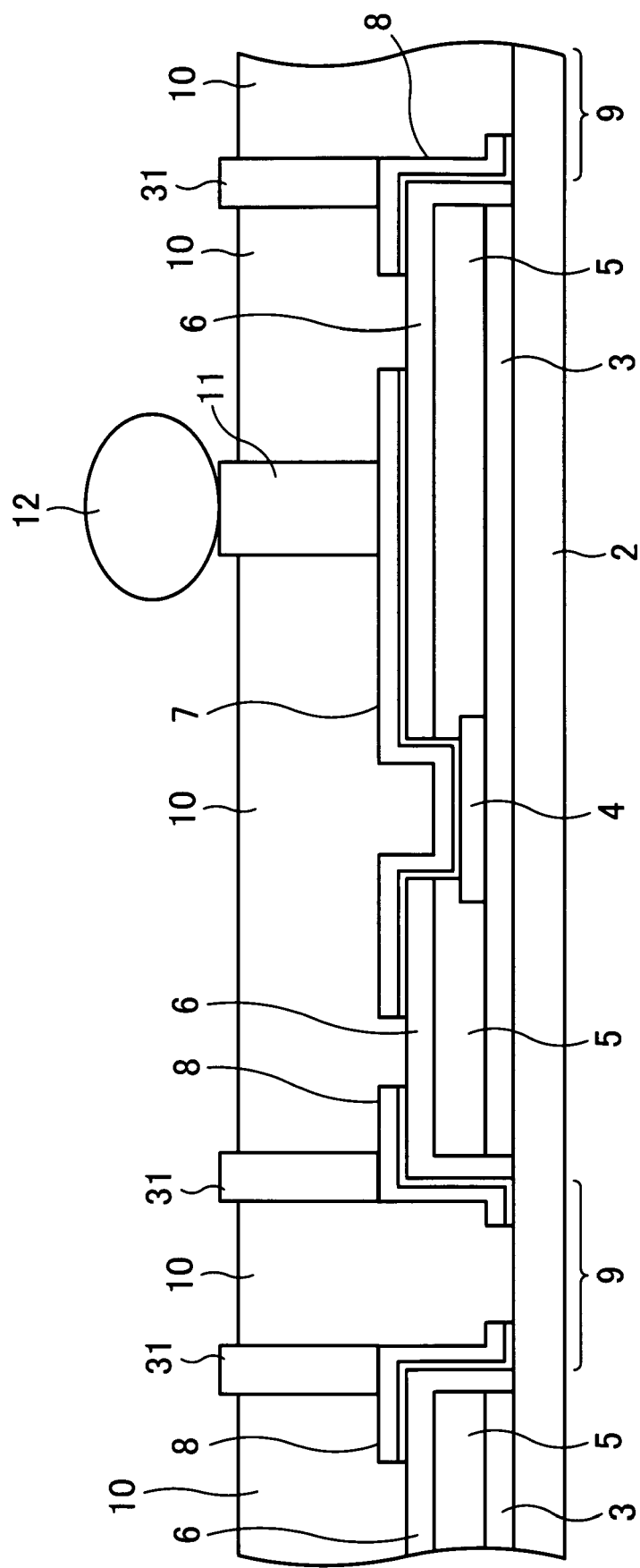
FIG. 39 is a schematic sectional view showing an important part of a solder bump formation process for fabricating the semiconductor device according to the third embodiment of the present invention.
Figure 40:
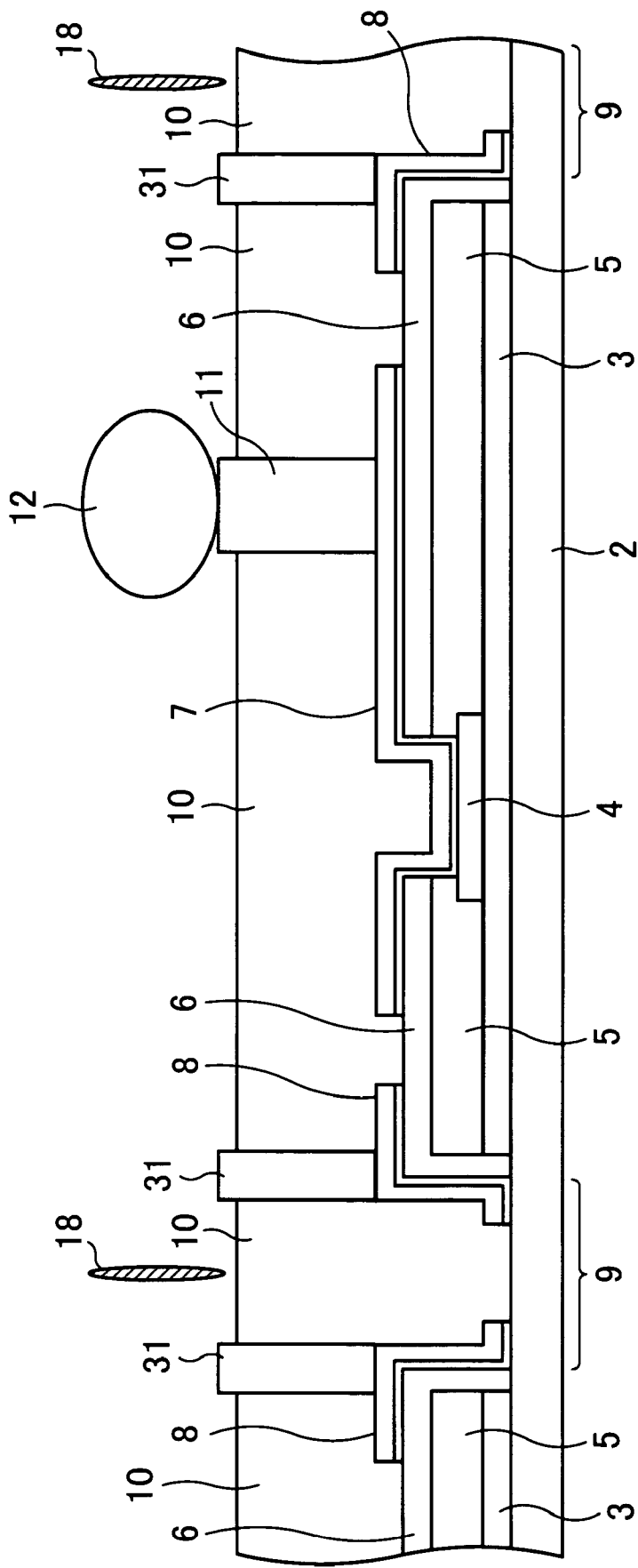
FIG. 40 is a schematic sectional view showing an important part of a dicing process for fabricating the semiconductor device according to the third embodiment of the present invention.

FIG. 36 is a schematic sectional view showing an important part of a seed metal etching process for fabricating the semiconductor device according to the third embodiment of the present invention. FIG. 37 is a schematic sectional view showing an important part of a sealing resin formation process for fabricating the semiconductor device according to the third embodiment of the present invention. FIG. 38 is a schematic sectional view showing an important part of a post exposure treatment process for fabricating the semiconductor device according to the third embodiment of the present invention. FIG. 39 is a schematic sectional view showing an important part of a solder bump formation process for fabricating the semiconductor device according to the third embodiment of the present invention. FIG. 40 is a schematic sectional view showing an important part of a dicing process for fabricating the semiconductor device according to the third embodiment of the present invention.

As shown in FIG. 36, after the resist film 32 used for forming the posts 11 and 31 is stripped, an exposed seed metal 14 is removed first by etching an entire surface with the plating layer 16 and the posts 11 and 31 as masks. As a result, a rewiring 7 and the dam layer 8 each including the seed metal 14 and the plating layer 16 are formed at predetermined positions.

As shown in FIG. 37, the sealing resin 10 is then formed by molding or coating an entire surface with a liquid resin. In this case, the sealing resin 10 must have sufficient thickness so that all the components will be sealed in the sealing resin 10. As shown in FIG. 38, part of the sealing resin 10 is removed by grinding, ashing, or the like in order to expose upper end portions of the posts 11 and 31 sealed inside the sealing resin 10. As shown in FIG. 39, after the upper end portions of the posts 11 and 31 are exposed, a solder bump 12 is formed only on the post 11.

Finally, as shown in FIG. 40, dicing is performed with a diamond saw 18. As a result, each semiconductor device 30 having the structure shown in FIG. 31 is obtained (the seed metal 14 included in the rewiring 7 and the dam layer 8 is not shown in FIG. 31 or 32).

By adopting the above method, the rewiring 7 and the dam layer 8 can be formed at the same time. In addition, the posts 11 and 31 can be formed at the same time. Accordingly, it is possible to form the dam layer 8 and the post 31 with a manufacturing apparatus now used without increasing the number of manufacturing processes. The rewiring 7 and the dam layer 8 may be formed in different processes. Moreover, the posts 11 and 31 may be formed in different processes.

A fourth embodiment of the present invention will now be described.

Figure 41:
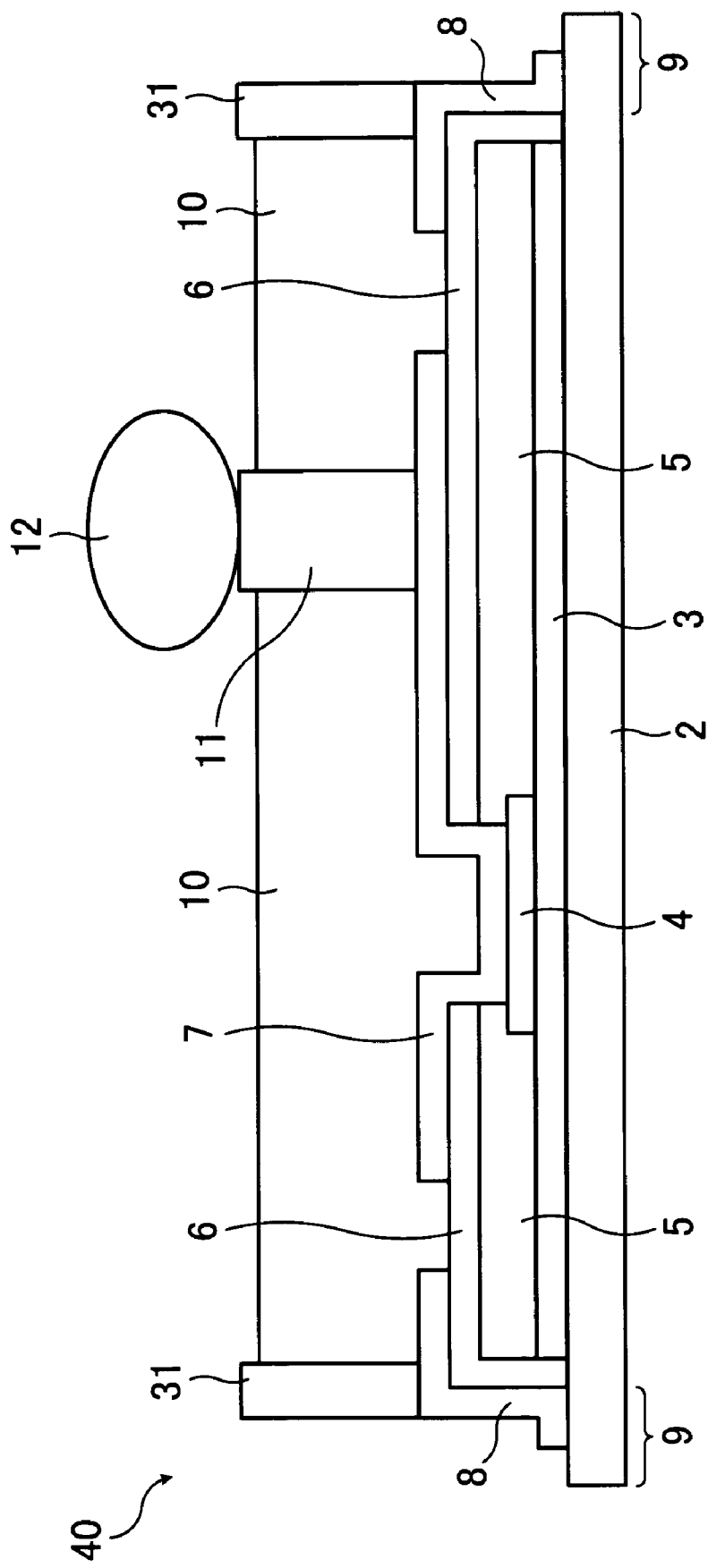
FIG. 41 is a schematic sectional view showing an important part of an example of a semiconductor device according to a fourth embodiment of the present invention.

FIG. 41 is a schematic sectional view showing an important part of an example of a semiconductor device according to a fourth embodiment of the present invention. Components in FIG. 41 that are the same as those shown in FIG. 31 are marked with the same symbols and detailed descriptions of them will be omitted.

A semiconductor device 40 shown in FIG. 41 differs from the above semiconductor device 30 according to the third embodiment of the present invention in that a sealing resin 10 is not formed outside a dam layer 8 and a post 31 which surround a chip on all sides.

The same effect that is obtained in the semiconductor device 30 according to the third embodiment of the present invention can be achieved in the semiconductor device 40 having the above structure. In addition, with the semiconductor device 40 according to the fourth embodiment of the present invention, the post 31 made of, for example, copper is exposed at the sides, so the semiconductor device 40 radiates more heat.

An example of a method for fabricating the semiconductor device 40 according to the fourth embodiment of the present invention will now be described.

The processes which are shown in FIGS. 33 through 36 and which are performed for fabricating the above semiconductor device 30 according to the third embodiment of the present invention are also performed for fabricating the semiconductor device 40. Subsequent processes will be described with reference to FIGS. 42 through 45.

Figure 42:
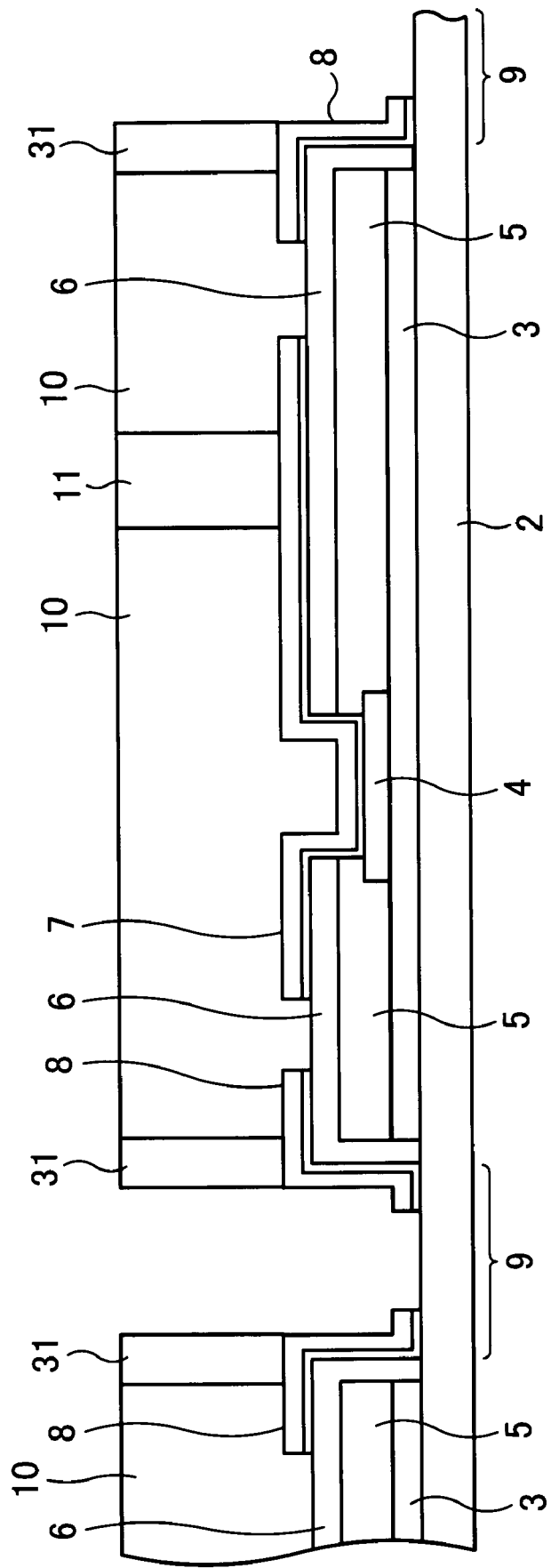
FIG. 42 is a schematic sectional view showing an important part of a sealing resin formation process for fabricating the semiconductor device according to the fourth embodiment of the present invention.
Figure 43:
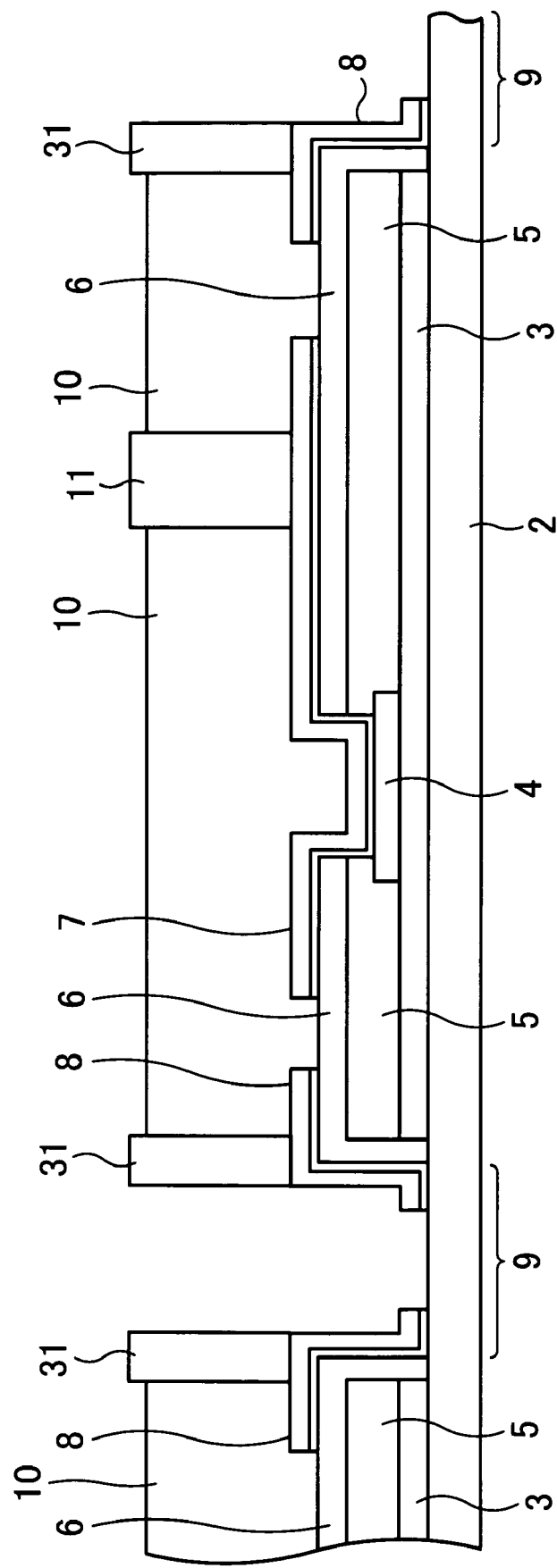
FIG. 43 is a schematic sectional view showing an important part of a post exposure treatment process for fabricating the semiconductor device according to the fourth embodiment of the present invention.
Figure 44:
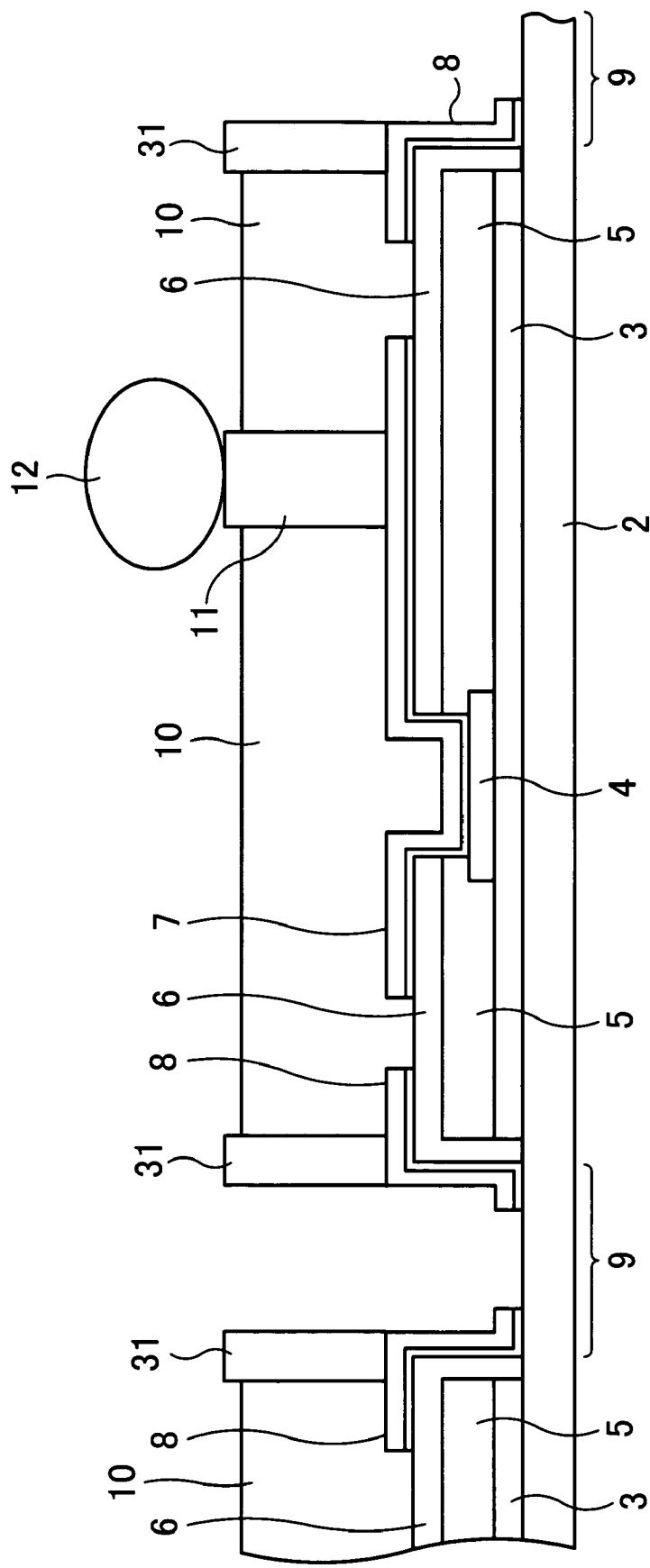
FIG. 44 is a schematic sectional view showing an important part of a solder bump formation process for fabricating the semiconductor device according to the fourth embodiment of the present invention.
Figure 45:
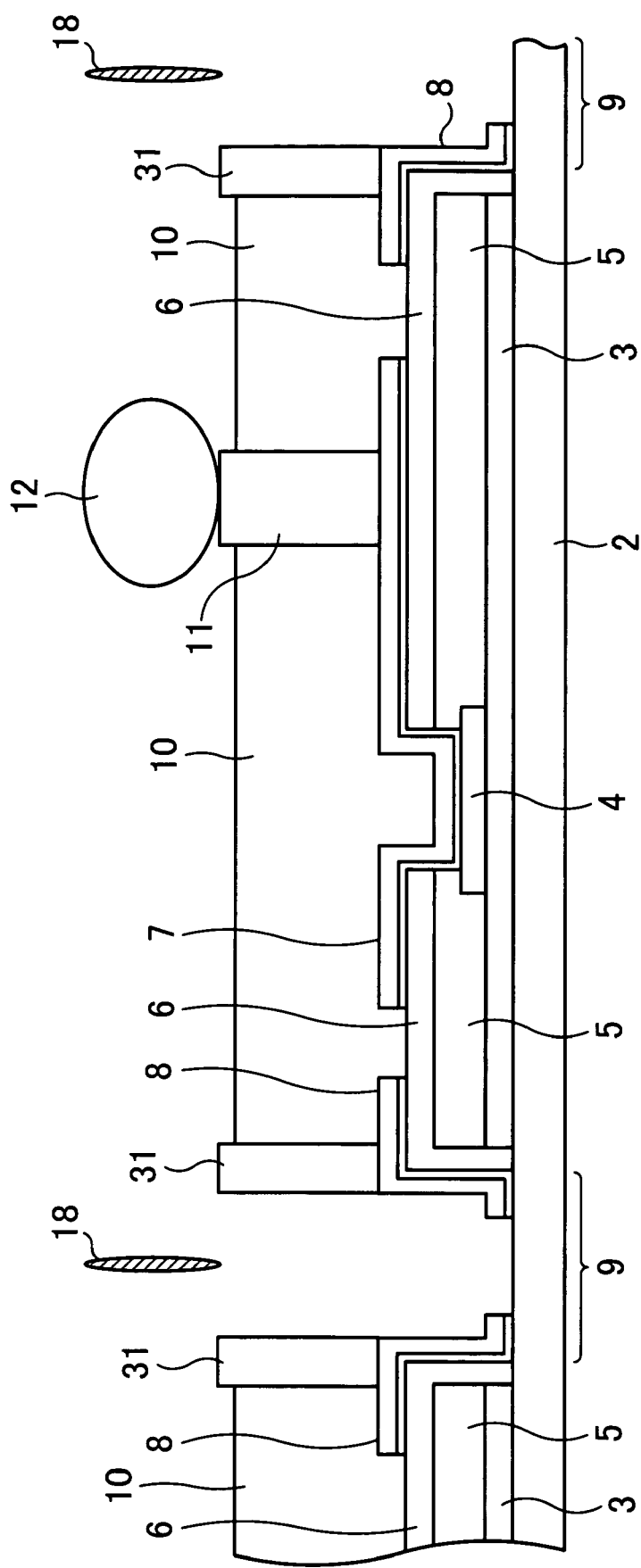
FIG. 45 is a schematic sectional view showing an important part of a dicing process for fabricating the semiconductor device according to the fourth embodiment of the present invention.

FIG. 42 is a schematic sectional view showing an important part of a sealing resin formation process for fabricating the semiconductor device according to the fourth embodiment of the present invention. FIG. 43 is a schematic sectional view showing an important part of a post exposure treatment process for fabricating the semiconductor device according to the fourth embodiment of the present invention. FIG. 44 is a schematic sectional view showing an important part of a solder bump formation process for fabricating the semiconductor device according to the fourth embodiment of the present invention. FIG. 45 is a schematic sectional view showing an important part of a dicing process for fabricating the semiconductor device according to the fourth embodiment of the present invention.

As shown in FIG. 36, an exposed seed metal 14 is removed by etching an entire surface. As a result, a rewiring 7 and the dam layer 8 each including the seed metal 14 and a plating layer 16 are formed. As shown in FIG. 42, the sealing resin 10 is then formed only in a region enclosed by the post 31. For example, a liquid resin is applied by using a mask having an opening corresponding to the region enclosed by the post 31. The region enclosed by the post 31 is filled with the liquid resin and the sealing resin 10 is formed.

As shown in FIG. 43, part of the sealing resin 10 is then removed by grinding, ashing, or the like in order to expose upper end portions of a post 11 and the post 31. As shown in FIG. 44, after the upper end portions of the posts 11 and 31 are exposed, a solder bump 12 is formed only on the post 11.

Finally, as shown in FIG. 45, dicing is performed with a diamond saw 18. As a result, each semiconductor device 40 having the structure shown in FIG. 41 is obtained (the seed metal 14 included in the rewiring 7 and the dam layer 8 is not shown in FIG. 41).

A fifth embodiment of the present invention will now be described.

Figure 46:
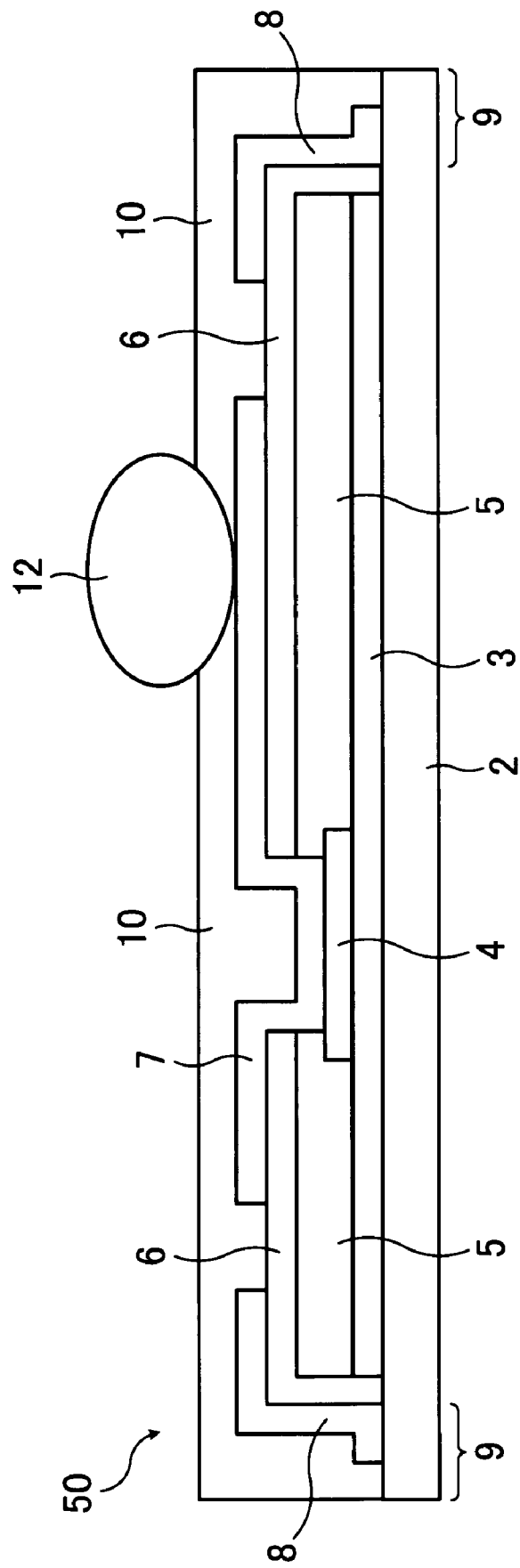
FIG. 46 is a schematic sectional view showing an important part of an example of a semiconductor device according to a fifth embodiment of the present invention.
Figure 47:
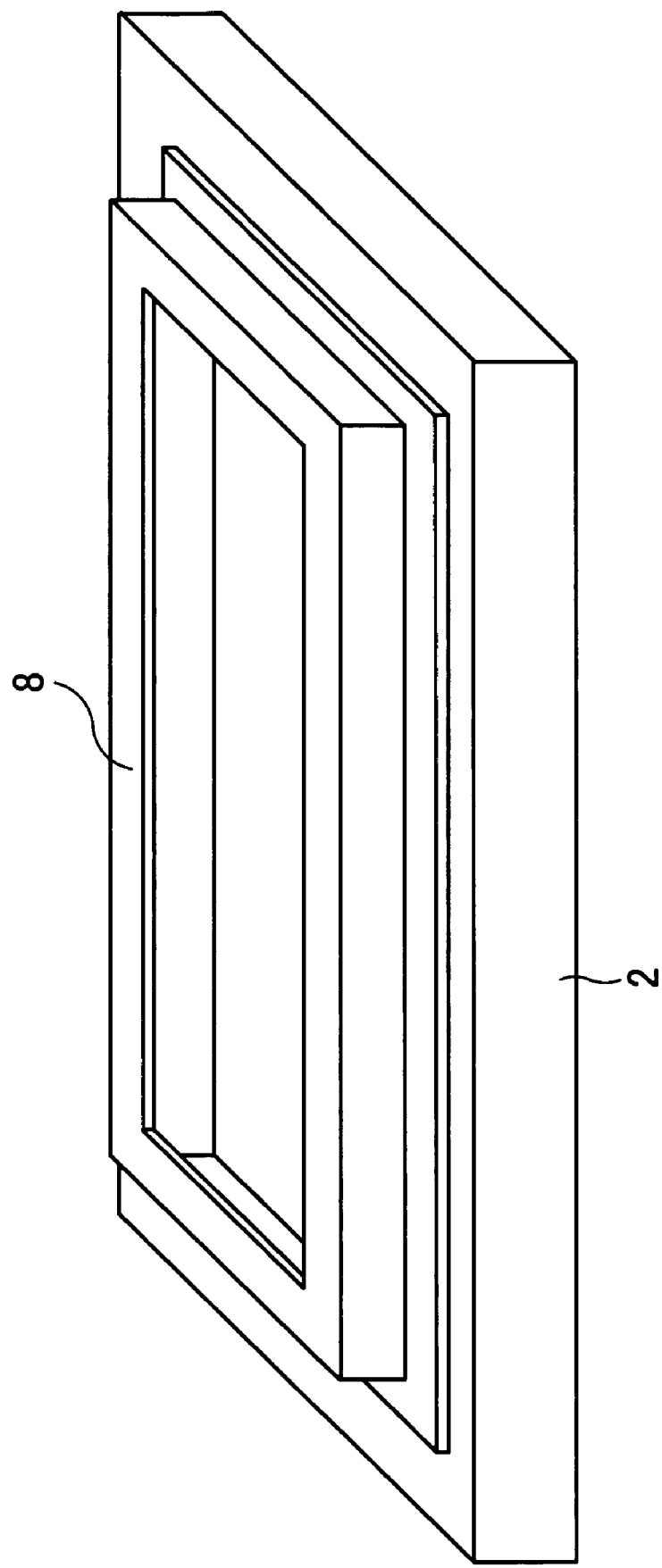
FIG. 47 is a schematic view showing a dam layer included in the semiconductor device according to the fifth embodiment of the present invention.

FIG. 46 is a schematic sectional view showing an important part of an example of a semiconductor device according to a fifth embodiment of the present invention. FIG. 47 is a schematic view showing a dam layer included in the semiconductor device according to the fifth embodiment of the present invention.

Components in FIGS. 46 and 47 that are the same as those shown in FIGS. 1 and 2 are marked with the same symbols and detailed descriptions of them will be omitted. In FIG. 47, only an Si substrate 2 and a dam layer 8 of the components of a semiconductor device 50 shown in FIG. 46 are shown and the other components of the semiconductor device 50 shown in FIG. 46 are not shown.

The semiconductor device 50 shown in FIG. 46 differs from the above semiconductor device 1 according to the first embodiment of the present invention in that it has a postless structure where a solder bump 12 is directly connected to a rewiring 7.

The same effect that is obtained in the semiconductor device 1 according to the first embodiment of the present invention can be achieved in the semiconductor device 50 having the above structure. In addition, the semiconductor device 50 does not include a post 11, so the semiconductor device 50 can be made thin.

The semiconductor device 50 having the above postless structure can be fabricated by the same procedure that is used for fabricating the semiconductor device 1 according to the first embodiment of the present invention. That is to say, the processes shown in FIGS. 7 through 12 are performed. In this case, a post 11 is not formed. The seed metal etching process shown in FIG. 16 is performed in a state in which there is no post 11, and the processes shown in FIGS. 17 through 20 are performed.

With the semiconductor device 50 having the above postless structure, the solder bump 12 is formed by selectively removing part of a sealing resin 10 which is at a position where the solder bump 12 is to be formed, forming a sealing resin 10 in a region except a position where the solder bump 12 is to be formed with an appropriate mask, or the like.

A sixth embodiment of the present invention will now be described.

Figure 48:
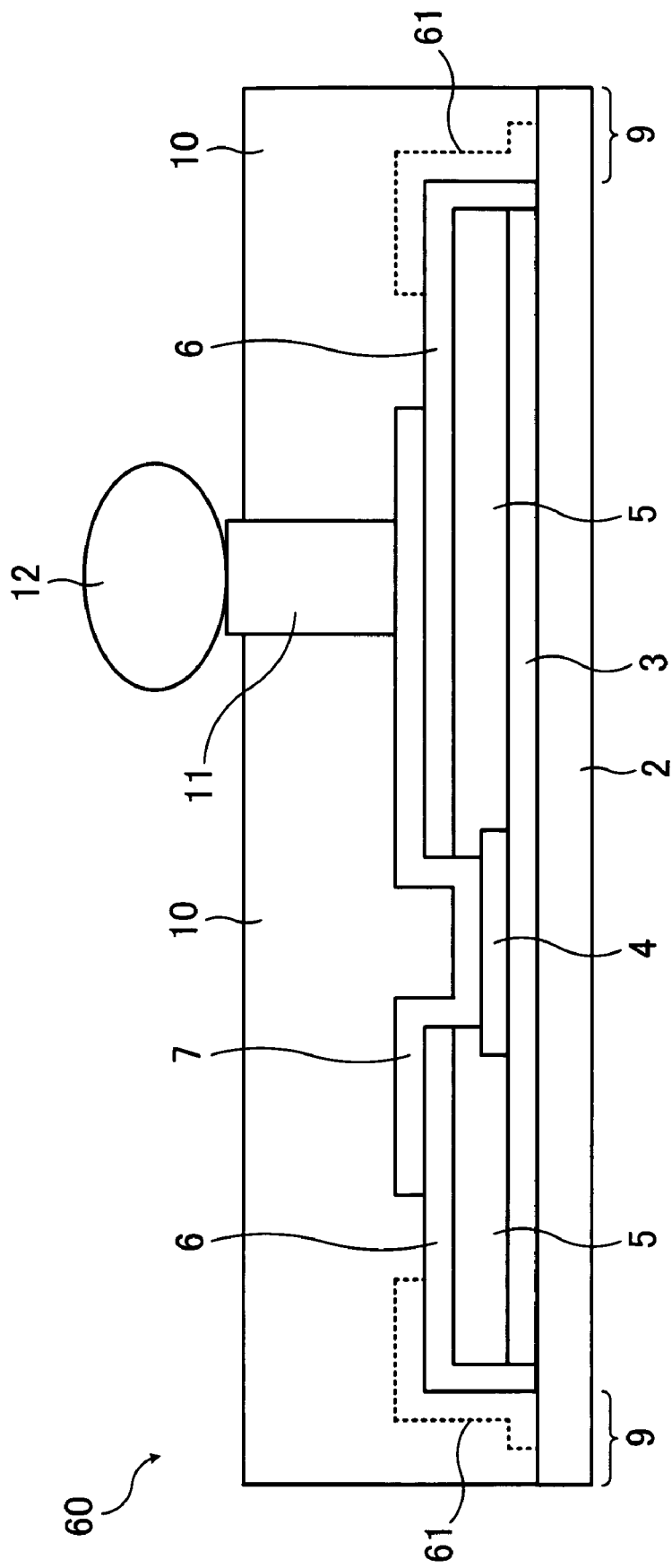
FIG. 48 is a schematic sectional view showing an important part of an example of a semiconductor device according to a sixth embodiment of the present invention.
Figure 49:
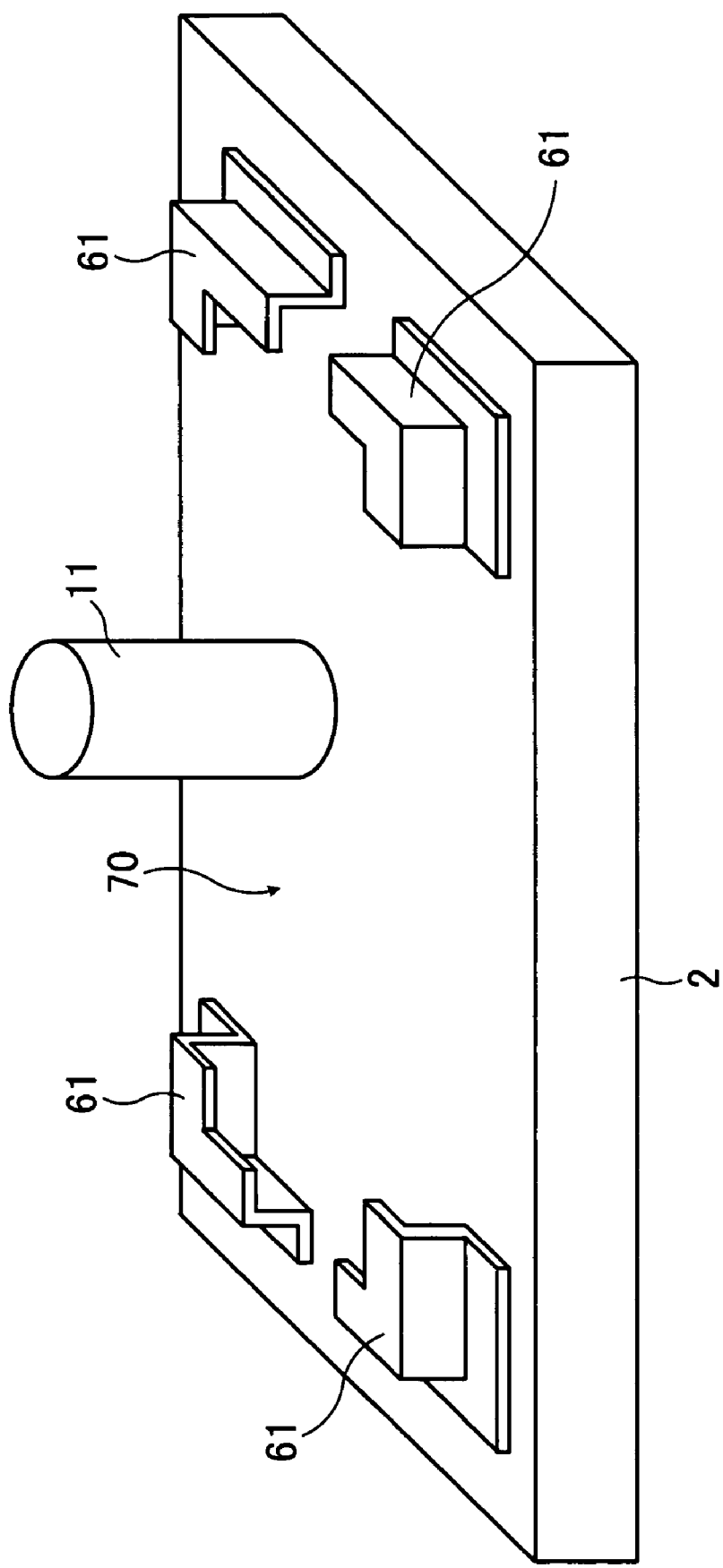
FIG. 49 is a schematic view showing a dam layer included in the semiconductor device according to the sixth embodiment of the present invention.
Figure 50:
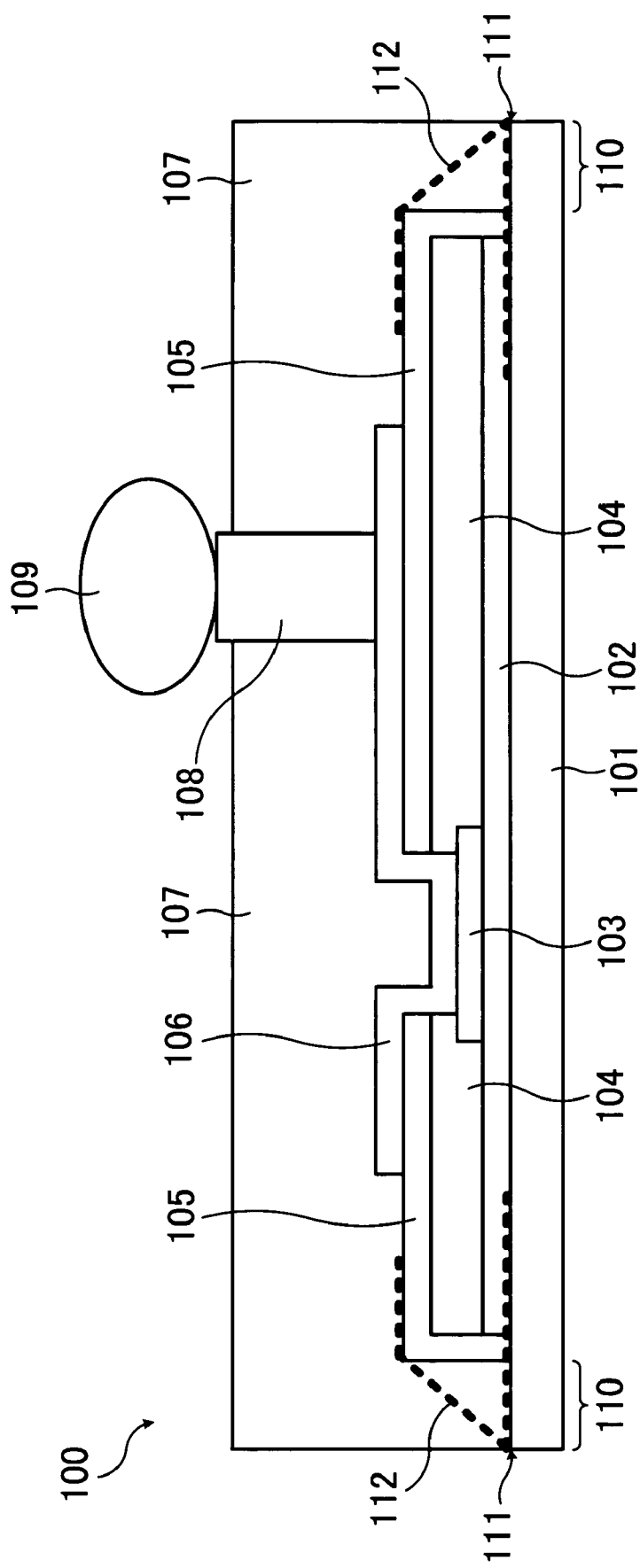
FIG. 50 is a schematic sectional view showing an important part of an example of a conventional semiconductor device having a WLP structure.

FIG. 48 is a schematic sectional view showing an important part of an example of a semiconductor device according to a sixth embodiment of the present invention. FIG. 49 is a schematic view showing a dam layer included in the semiconductor device according to the sixth embodiment of the present invention.

Components in FIGS. 48 and 49 that are the same as those shown in FIGS. 1 and 2 are marked with the same symbols and detailed descriptions of them will be omitted. In FIG. 49, only an Si substrate 2, dam layers 61, and a post 11 of the components of a semiconductor device 60 shown in FIG. 48 are shown and the other components of the semiconductor device 60 shown in FIG. 48 are not shown.

As shown in FIG. 49, the semiconductor device 60 shown in FIG. 48 differs from the above semiconductor device 1 according to the first embodiment of the present invention in that the dam layers 61 each having a plane L shape are formed on the four corners of a chip.

With the semiconductor device 60 having the above structure, the dam layers 61 are formed on the four corners of the chip, so the same effect that is obtained in the semiconductor device 1 according to the first embodiment of the present invention can be achieved. In this case, the amount of a material used for forming the dam layers 61 can be reduced and the effect of preventing the peeling of a sealing resin 10 or the like can be obtained.

The semiconductor device 60 can be fabricated by the same procedure that is used for fabricating the semiconductor device 1 according to the first embodiment of the present invention. That is to say, the processes shown in FIGS. 7 through 9 are performed first. In the process shown in FIG. 10, a resist pattern having openings corresponding to regions where a rewiring 7 and the dam layers 61 are to be formed is formed. After that, the processes shown in FIGS. 11 through 20 should be performed.

With the semiconductor device 60 according to the sixth embodiment of the present invention, the dam layers 61 are formed on the four corners of the chip. However, there is no need to form the dam layers 61 on the four corners of the chip. If a plurality of dam layers are formed on edge portions of the chip at fixed intervals, the same effect that is obtained by forming the above dam layers 61 can be achieved. In this case, the shape of each dam layer is not limited to a plane L shape each of the dam layers 61 has.

With the semiconductor device 60 according to the sixth embodiment of the present invention, posts may be formed on the dam layers 61 formed on, for example, the four corners of the chip. By doing so, the same effect that is obtained in the semiconductor device 20 according to the second embodiment of the present invention can be achieved.

As has been described in the semiconductor devices 1, 20, 30, 40, 50, and 60 each having a WLP structure according to the first through sixth embodiments, respectively, of the present invention, the dam layer 8 that surrounds the chip on all sides is formed, the posts 21 or the post 31 is formed on the dam layer 8, or the dam layers 61 are formed on edge portions of the chip at fixed intervals. In this case, adhesion between the dam layer 8 and the PI film 6, between the dam layers 61 and the PI film 6, between the dam layer 8 and the Si substrate 2, between the dam layers 61 and the Si substrate 2, between the dam layer 8 and the sealing resin 10, between the dam layers 61 and the sealing resin 10, between the posts 21 and the sealing resin 10, and between the post 31 and the sealing resin 10 can be increased by properly selecting materials for the dam layers 8 and 61 and the posts 21 and 31 and materials for members which touch them. This prevents the peeling of the sealing resin 10 or peeling inside the chip. Even if the semiconductor devices 1, 20, 30, 40, 50, and 60 are in a heating environment, their performance can be maintained.

If the posts 21 or the post 31 is formed, package strength, a heat radiation characteristic, or the like can be improved.

By connecting the dam layer 8 or the dam layers 61 to a ground electrode, a shielding effect can be obtained.

In the above descriptions of the semiconductor devices 1, 20, 30, 40, 50, and 60, a material for each component, the thickness of each component, and the like are simple examples. These conditions can be changed according to environments in which the semiconductor devices 1, 20, 30, 40, 50, and 60 are used, their characteristics required, or the like.

Each of the above semiconductor devices has a WLP structure. However, the above descriptions also apply to conventional semiconductor devices which are fabricated by dividing a wafer into individual chips and sealing each chip in resin.

In the present invention, a dam layer is formed on an edge portion of a chip between the chip and a sealing resin. As a result, firm adhesion is obtained between the chip and the dam layer and between the dam layer and the sealing resin. This prevents the peeling of the sealing resin off the chip or peeling inside the chip even in a heating environment. Therefore, a highly reliable semiconductor device having superior heat resistance can be realized. In addition, by using the WLP technique, a highly reliable high-performance semiconductor device having a WLP structure can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device comprising:
   a chip;
   a film layer formed on a part of a first surface of the chip;
   a rewiring formed on a part of the film layer;
   a dam layer formed on an edge portion and a side portion of the film layer and provided over a part of the first surface of the chip; and a sealing resin formed over the first surface of the chip and covering the dam layer, the rewiring and the film layer.

2. The semiconductor device according to claim 1, wherein the dam layer is formed so as to surround the film layer on all sides.

3. The semiconductor device according to claim 1, wherein a post is formed on the dam layer.

4. The semiconductor device according to claim 1, wherein:

the dam layer is formed so as to surround the film layer on all sides; and a post is formed on the dam layer which is formed so as to surround the-film layer on all sides.

5. The semiconductor device according to claim 1, wherein:

the dam layer is formed so as to surround the film layer on all sides; and posts are formed on the dam layer which is formed so as to surround the film layer on all sides at fixed intervals.

6. The semiconductor device according to claim 4, wherein the post is formed on all of the dam layer which is formed so as to surround the film layer on all sides.

7. The semiconductor device according to claim 6, wherein an outer surface of the post formed on all of the dam layer which is formed so as to surround the film layer on all sides is not covered with the sealing resin and is exposed.

8. The semiconductor device according to claim 1, wherein the dam layer is formed on edge portions of the film layer at fixed intervals.

9. The semiconductor device according to claim 1, wherein the film layer comprises:

an interlayer dielectric film;

a cover film; and a polyimide film.

* * * * *

UNITED STATES PATENT AND TRADEMARK OFFICE
CERTIFICATE OF CORRECTION

| | | |
|---|---|---|
| PATENT NO. | : 7,602,055 B2 | Page 1 of 1 |
| APPLICATION NO. | : 11/390200 | |
| DATED | : October 13, 2009 | |
| INVENTOR(S) | : Nosaka et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 224 days.

Signed and Sealed this
Third Day of May, 2011

David J. Kappos
*Director of the United States Patent and Trademark Office*